(12) United States Patent
Chaumeil et al.

(10) Patent No.: US 12,701,681 B2
(45) Date of Patent: Aug. 4, 2026

(54) SYSTEMS AND METHODS FOR A POWER ELECTRONICS ASSEMBLY OF AN IMAGING SYSTEM

(71) Applicant: GE Precision Healthcare LLC, Waukesha, WI (US)

(72) Inventors: Jonathan Chaumeil, Buc (FR); Nicolas Levilly, Buc (FR)

(73) Assignee: GE PRECISION HEALTHCARE LLC, Waukesha, WI (US)

( * ) Notice: Subject to any disclaimer, the term of this patent is extended or adjusted under 35 U.S.C. 154(b) by 328 days.

(21) Appl. No.: 18/611,421

(22) Filed: Mar. 20, 2024

(65) Prior Publication Data

US 2025/0301557 A1 Sep. 25, 2025

(51) Int. Cl.
| | |
|---|---|
| *H05K 7/20* | (2006.01) |
| *H05K 1/02* | (2006.01) |
| *H05G 1/02* | (2006.01) |

(52) U.S. Cl.
CPC ........... H05K 7/209 (2013.01); H05K 1/0203 (2013.01); H05G 1/025 (2013.01)

(58) Field of Classification Search
CPC .................................................. H05K 1/0203
See application file for complete search history.

(56) References Cited

U.S. PATENT DOCUMENTS

| | | | | |
|---|---|---|---|---|
| 6,509,629 B2 * | 1/2003 | Yoshimatsu | .......... | H10W 42/20 |
| | | | | 257/691 |
| 9,414,520 B2 * | 8/2016 | Campbell | .......... | H05K 7/20936 |

| | | | | |
|---|---|---|---|---|
| 11,273,818 B2 * | 3/2022 | Sawada | .................. | H05K 7/209 |
| 11,889,662 B1 * | 1/2024 | Yang | .................. | H05K 7/20509 |
| 12,284,749 B2 * | 4/2025 | Maier | .................. | H05K 1/0209 |

FOREIGN PATENT DOCUMENTS

| | | | | |
|---|---|---|---|---|
| WO | WO-2007142023 A1 * | 12/2007 | ............. | H05K 7/209 |

OTHER PUBLICATIONS

WO 2007142023 A1, English Translation. (Year: 2007).*
"GE HealthCare Receives FDA Clearance of Allia IGS Pulse—the Next Generation of Image-Guided Systems Designed for Cardiac Imaging Excellence," GE HealthCare Website, Available Online at https://www.gehealthcare.com/about/newsroom/press-releases/ge-healthcare-receives-fda-clearance-of-allia-igs-pulse-the-next-generation-of-image-guided-systems-designed-for-cardiac-imaging-excellence?npclid=botnpclid, Oct. 16, 2023, 6 pages.

* cited by examiner

*Primary Examiner* — Mukundbhai G Patel

(74) *Attorney, Agent, or Firm* — McCoy Russell LLP

(57) ABSTRACT

Systems and methods for a power electronics assembly. The power electronics assembly includes, in one example, a gate board electronically connected to a power board, a plurality of power modules which each include multiple power terminals which are electronically connected to the power board via multiple attachment devices, and multiple interconnection boards. In the power electronics assembly, each of the plurality of interconnection boards are electronically connected to the gate board via multiple gate board terminals and one of the power modules via multiple control terminals.

20 Claims, 32 Drawing Sheets

SYSTEMS AND METHODS FOR A POWER ELECTRONICS ASSEMBLY OF AN IMAGING SYSTEM

TECHNICAL FIELD

The present description relates generally to a power electronics assembly. More specifically, the present disclosure relates to a space-efficient power electronics assembly in an imaging system.

BACKGROUND

Power electronics are used in imaging systems to convert direct current (DC) to alternating current (AC). In some embodiments, the power electronics are used in conjunction with high voltage tanks to provide power to x-ray tubes. Interventional radiology as well as other imaging systems such as computed tomography (CT) systems use power electronics and x-ray tubes. Interventional radiology encompasses a wide range of procedures that involve guiding small tools into the body and using an imaging system to track the progress of the insertion. In computed tomography (CT) imaging systems, an x-ray source emits an x-ray beam toward a subject or object, such as a patient. After attenuation by the subject, the x-ray beam impinges upon a detector array. An intensity of the attenuated beam radiation received at the detector array depends on attenuation of the x-ray beam by the subject. Each detector element of the detector array produces a separate electrical signal which is transmitted to a data processing system for analysis and generation of a medical image.

BRIEF DESCRIPTION

The above challenges may be at least partially addressed, in one embodiment where a power electronics assembly is provided. The power electronics assembly includes a gate board electronically connected to a power board. The power electronics assembly further includes multiple power modules which each include multiple power terminals which are electronically connected to the power board via multiple attachment devices. The power electronics assembly even further includes multiple interconnection boards and in the assembly each of the interconnection boards are electronically connected to the gate board via multiple gate board terminals and one of the power modules via multiple control terminals.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Various aspects of this disclosure may be better understood upon reading the following detailed description and upon reference to the drawings in which.

Figure 1:
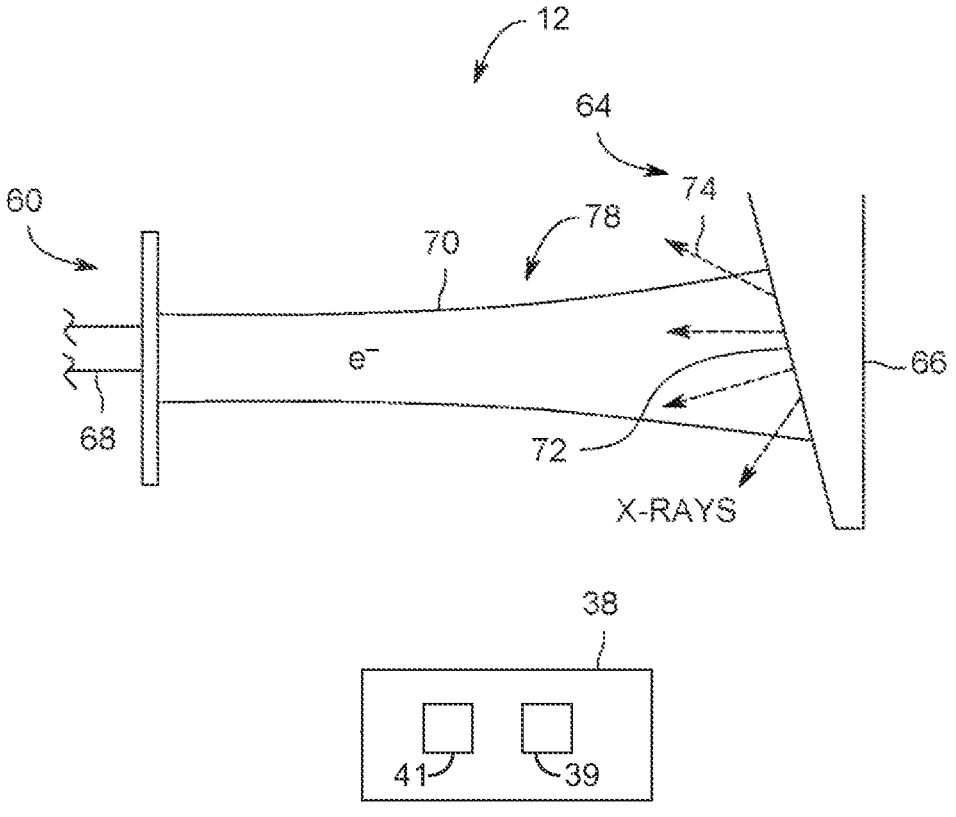
FIG. 1 is a schematic illustration of an embodiment of a portion of an X-ray tube coupled to an X-ray controller/power, in accordance with various embodiments.

The drawings illustrate specific aspects of the described systems and methods. Together with the following description, the drawings demonstrate and explain the structures, methods, and principles described herein. In the drawings, the size of components may be exaggerated or otherwise modified for clarity. Well-known structures, materials, or operations are not shown or described in detail to avoid obscuring aspects of the described components, systems and methods.

DETAILED DESCRIPTION

Conventional inverters make use of cables, such as twisted cables, to provide a gate signal connection between power modules and gate driver boards. However, these inverters experience undesirable parasitic inductance, thereby decreasing inverter capability and reliability. Furthermore, swapping the cables may be difficult and even unfeasible in certain inverters and the cables may be more susceptible to degradation than other types of electronics connections, such as mated terminals. These inverters additionally make use of multiple gate driver boards in space-inefficient arrangements, which may cause packaging challenges especially in space-constrained operating environments, such as interventional imaging cabinet and computed tomography (CT) gantries and power cabinets in interventional imaging systems. For example, certain inverters include gate boards which are vertically arranged in relation to power modules which are positioned adjacent to one another in a lengthwise manner. This results in a space-inefficient component packaging, which the inventors have recognized as leaving room to enhance the inverter's space efficiency.

The following description relates to the methods and systems for space efficiently packaging a power electronics assembly that provides power to a component, such as an x-ray tube, into a provided space when the assembly is incorporated into an imaging system. To elaborate, the power electronics assembly described herein increases the assembly's capability and reliability by reducing the length of the gate signal connections, which results in much lower parasitic inductive connections when compared to other inverters that have lengthy connection wires. The power electronics assembly compactly layers a gate board (e.g., gate driver board), a power board, and power modules. The electrical connections between the gate board, the power board, and the power modules are formed via interconnection boards as opposed to twisted wires, which have been used in other inverters, as indicated above. These interconnection boards allow for more robust electrical connections to be established between the assembly's electronic components. Further, the power electronics assembly described herein is able to further reduce the volume of the assembly by using an available volume between a heat sink and the power board for placement of the gate board. The compact design of the power electronics assembly allows the assembly to be integrated into space-constrained operating environments, such as in an electric cabinet of an interventional radiology imaging system or in a CT imaging system. However, the power electronics assembly has wide applicability across a range of fields, such as automotive applications, industrial applications, and the like. The design of the power electronics assembly described herein also allows the assembly to be more efficiently manufactured, serviced, and repaired with a diminished chance of improper manufacture or repair due to the effective types of electrical connections used between the boards and the power modules in the assembly. The power electronic assembly therefore has greater customer appeal. The space-efficient power electronics assembly also allows the parts count in the assembly to be reduced if so desired, thereby simplifying manufacturing and assembly, which even further increases customer appeal.

Figure 2:
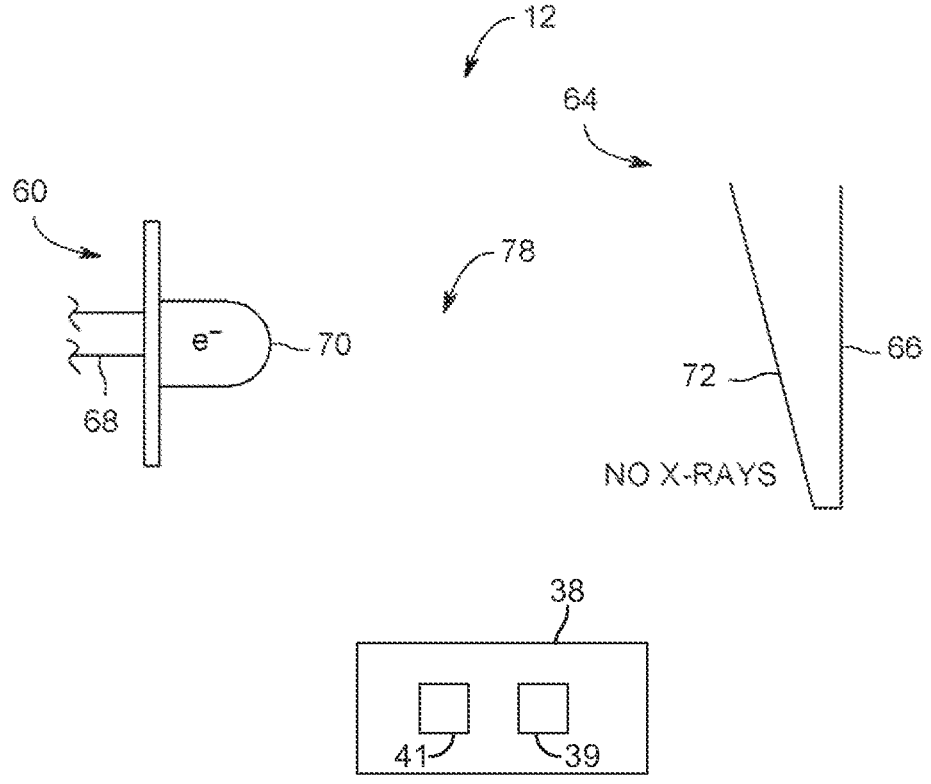
FIG. 2 is a schematic illustration of an embodiment of a portion of an X-ray tube coupled to an X-ray controller/power supply, in accordance with various embodiments.
Figure 3:
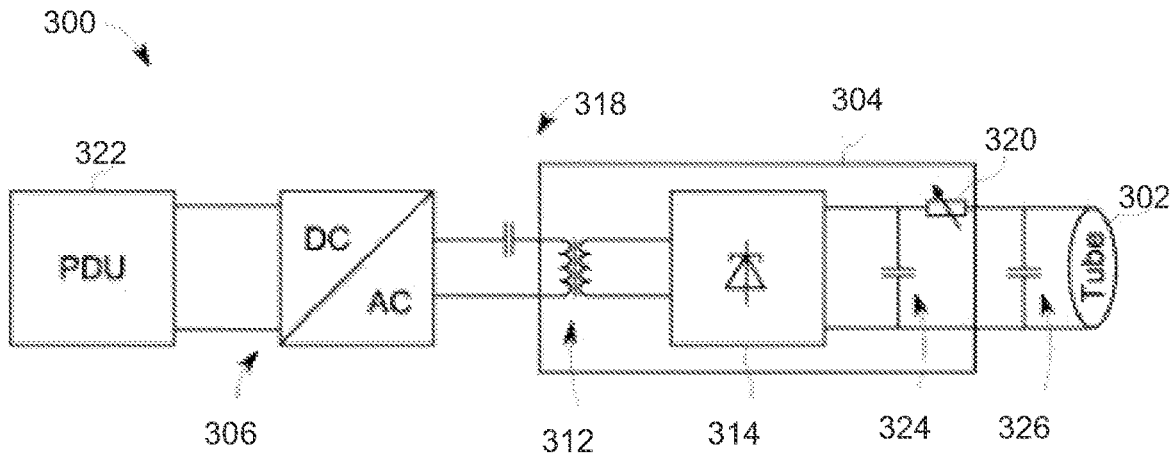
FIG. 3 is a schematic diagram of an embodiment of an X-ray generator.
Figure 11:
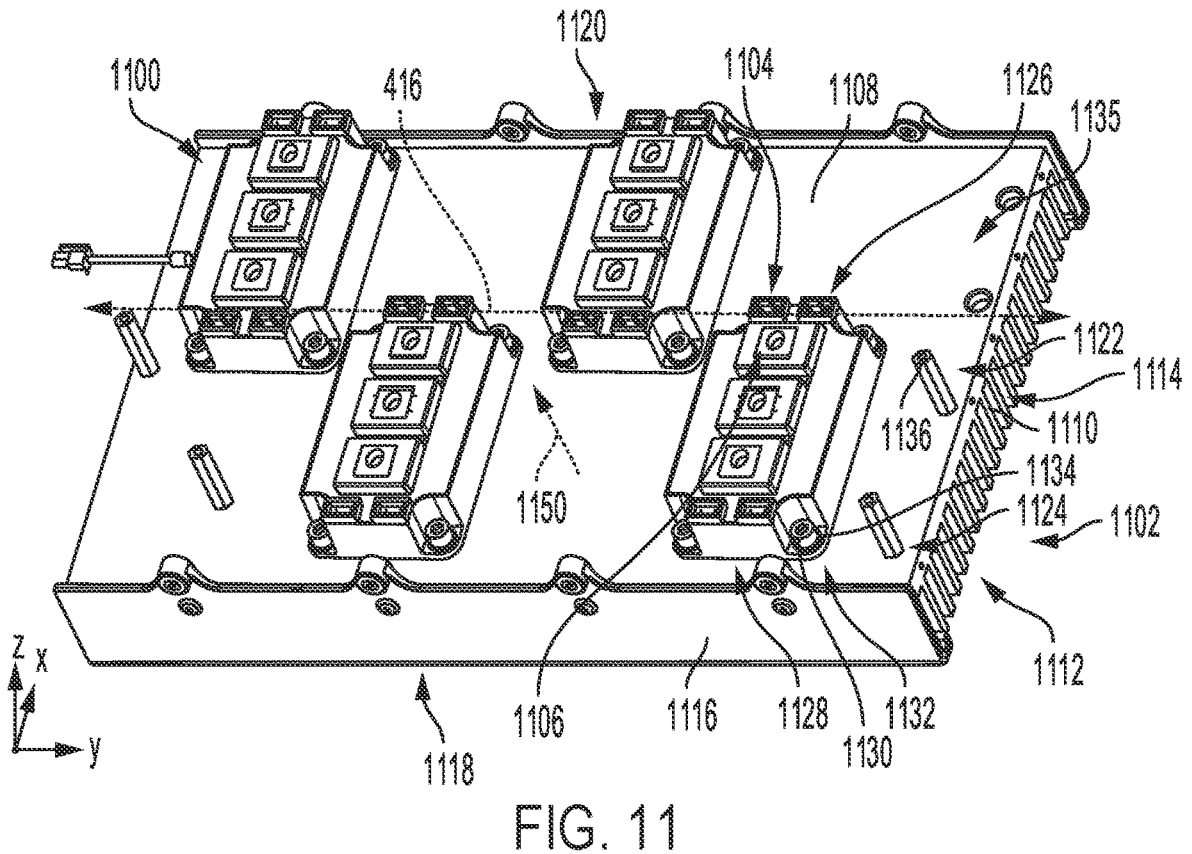
FIG. 11 is a detailed illustration of power modules and a heat sink in the power electronics assembly.
Figure 12:
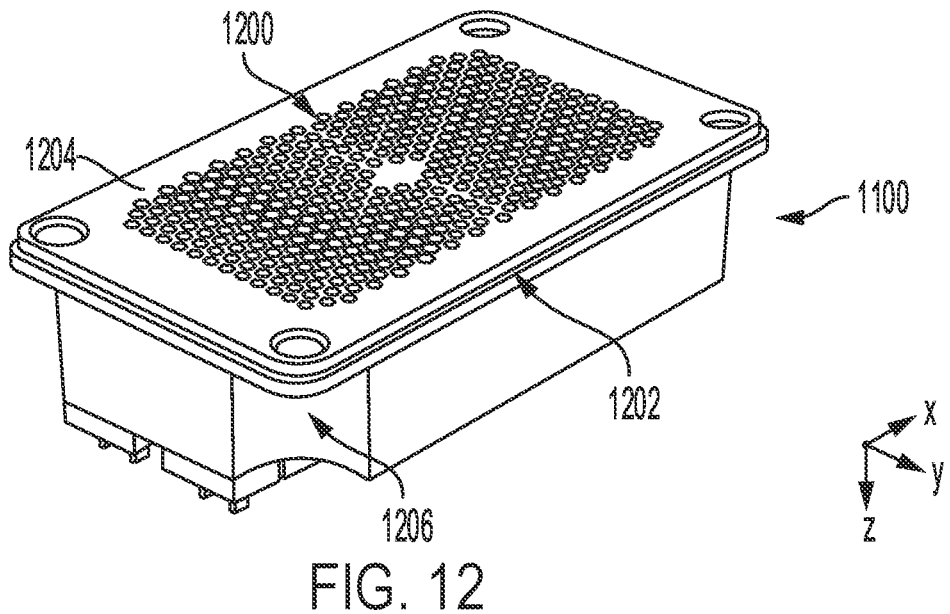
FIG. 12 is a detailed view of one of the power modules, depicted in FIG. 11.
Figure 13:
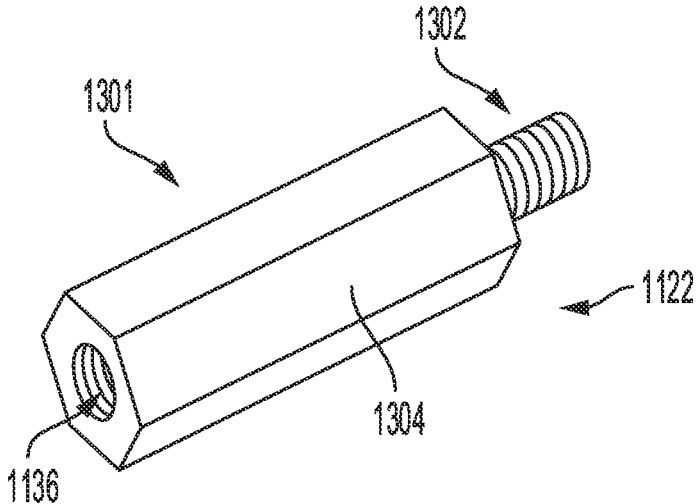
FIG. 13 is a detailed view of a spacer in the heat sink, depicted in FIG. 11.
Figure 14:
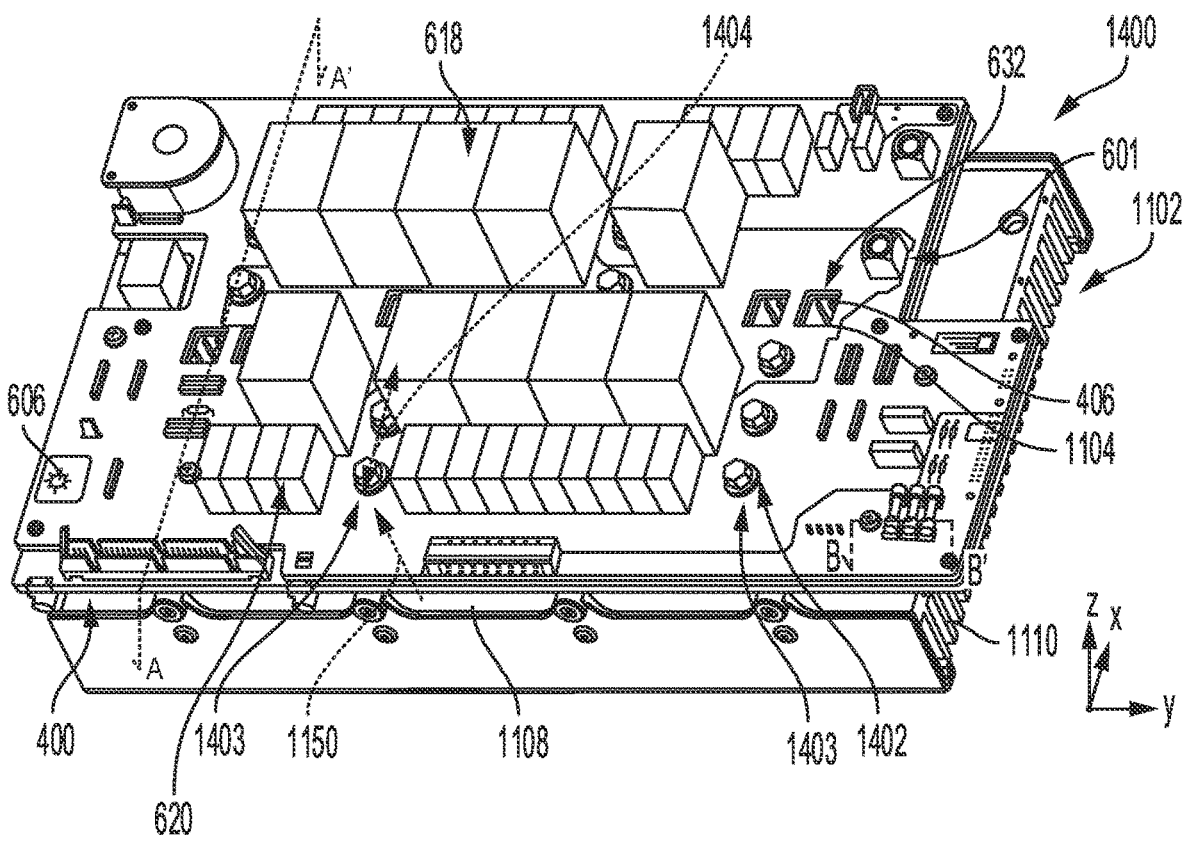
FIG. 14 is an assembled view of the power electronics assembly.
Figure 15:
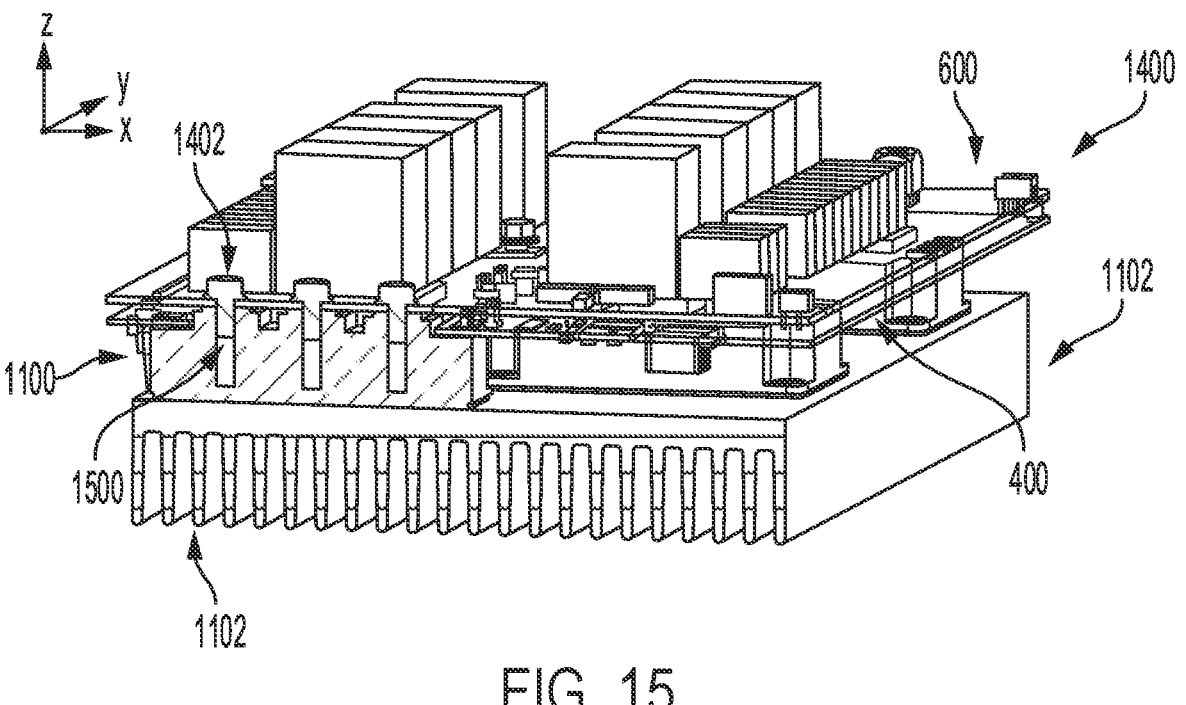
FIGS. 15-16 are cross-sectional views of an interface between the power board and power terminals in the power modules, depicted in FIG. 14.
Figure 16:
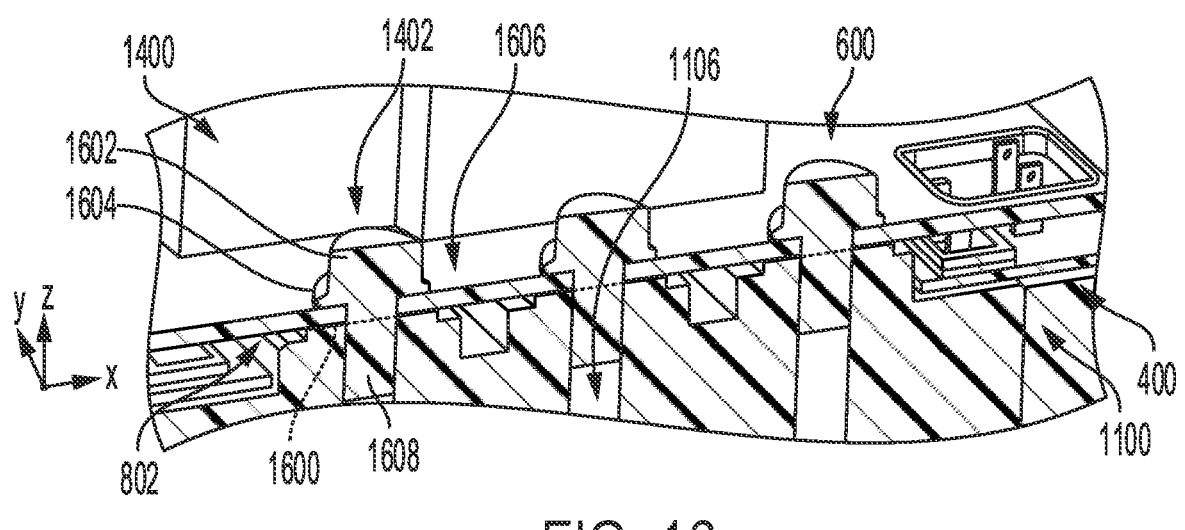
Figure 17:
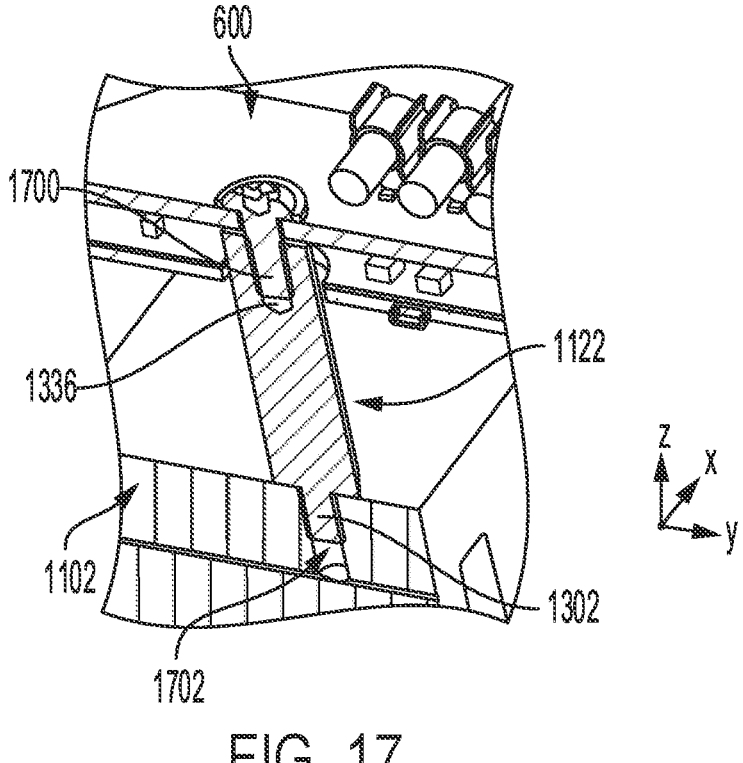
FIG. 17 is cross-sectional view of an attachment device which couples the power board, the gate board, and the heat sink in the power electronics assembly, depicted in FIG. 14.
Figure 24:
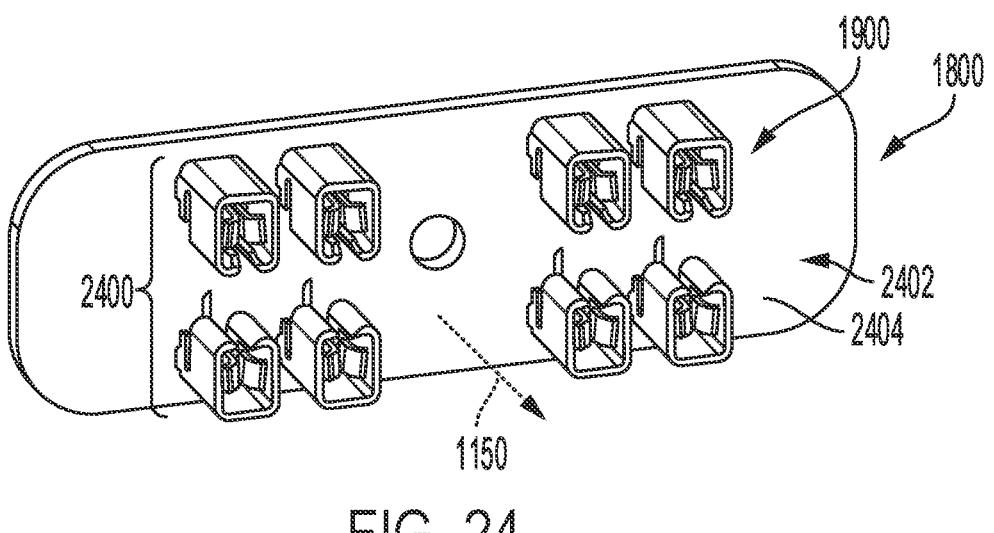
Figure 25:
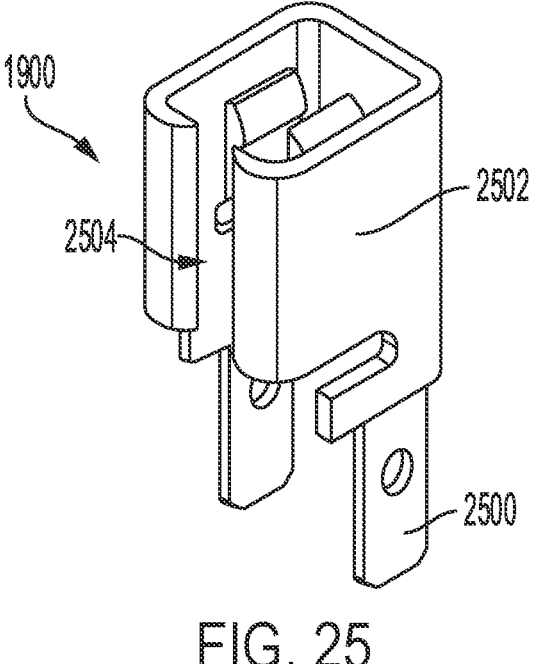
Figure 26:
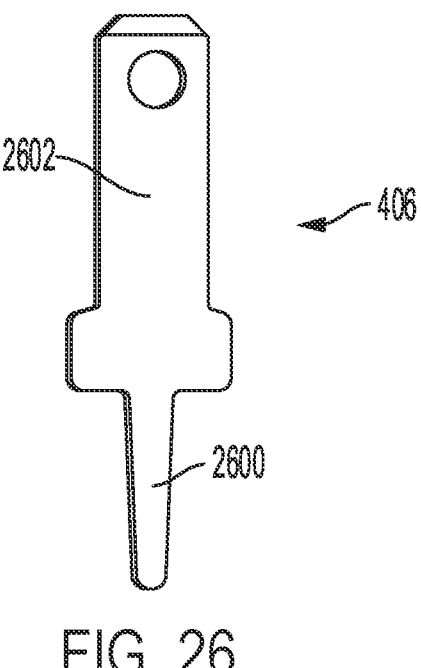
Figure 27:
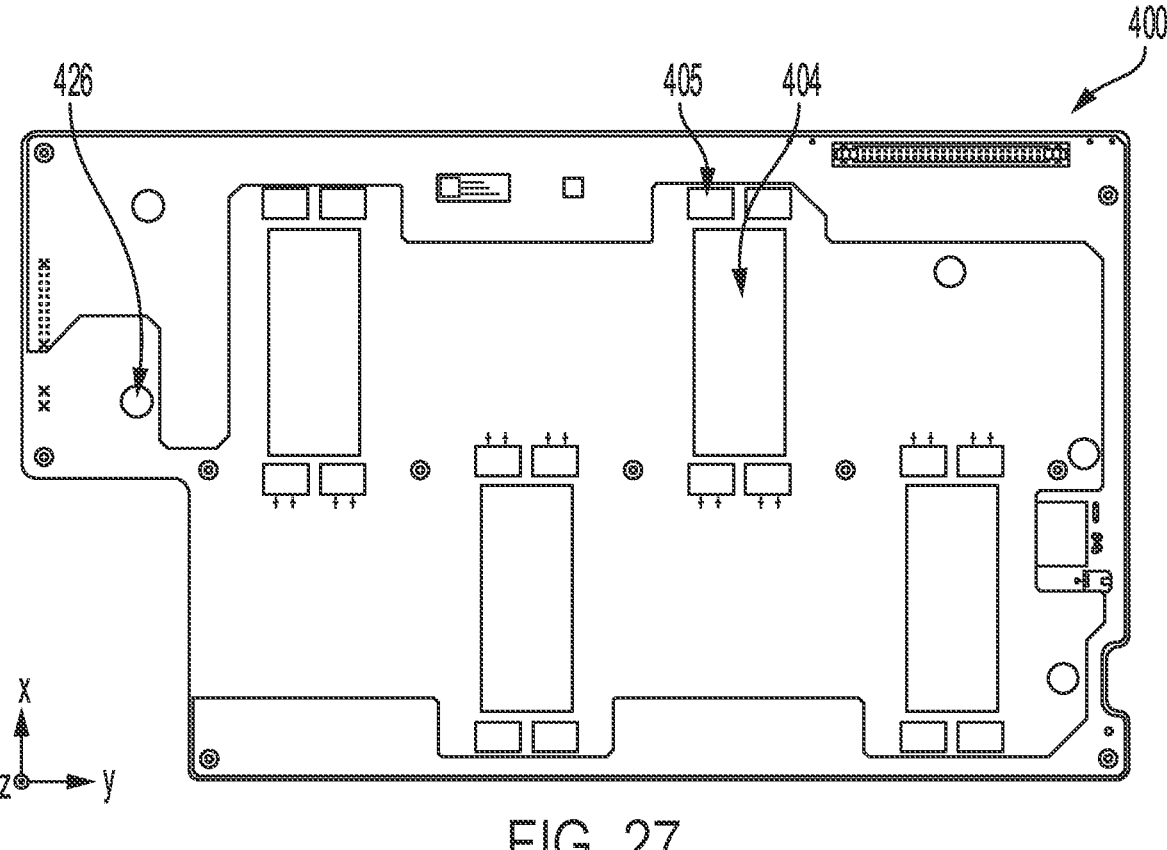
FIGS. 27-28 are top and bottom views, respectively, of the gate board.
Figure 28:
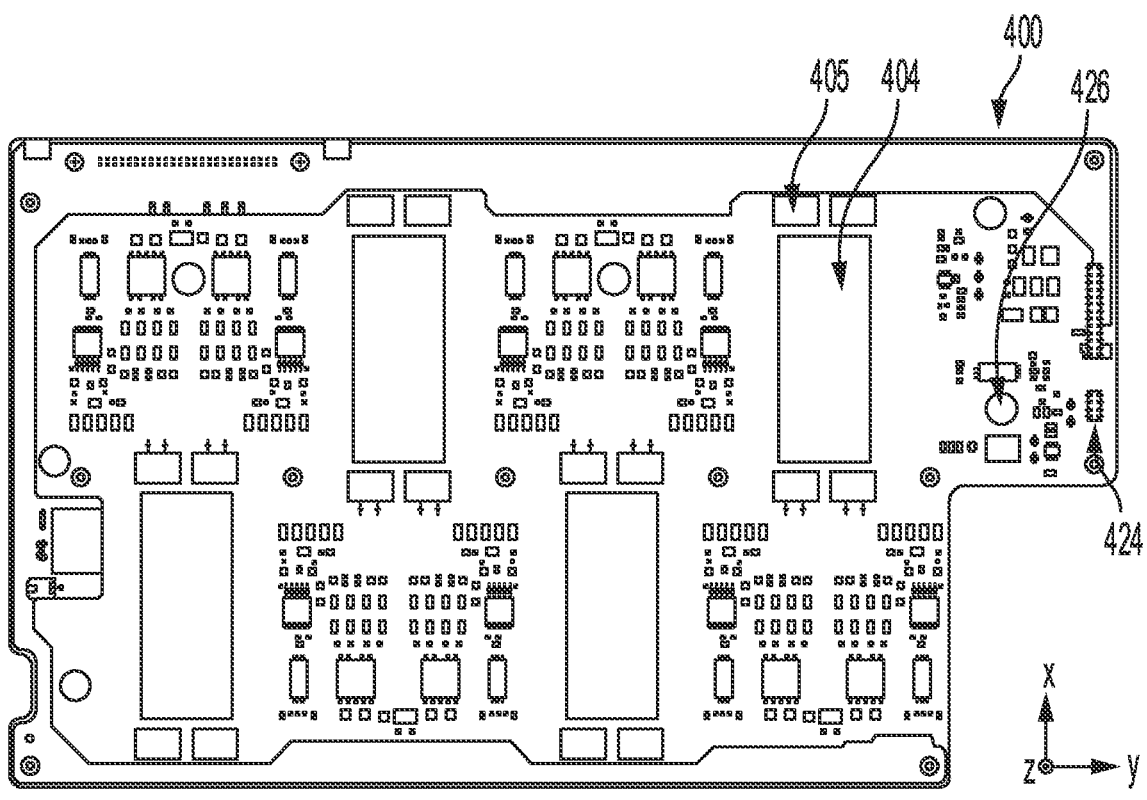
Figure 29:
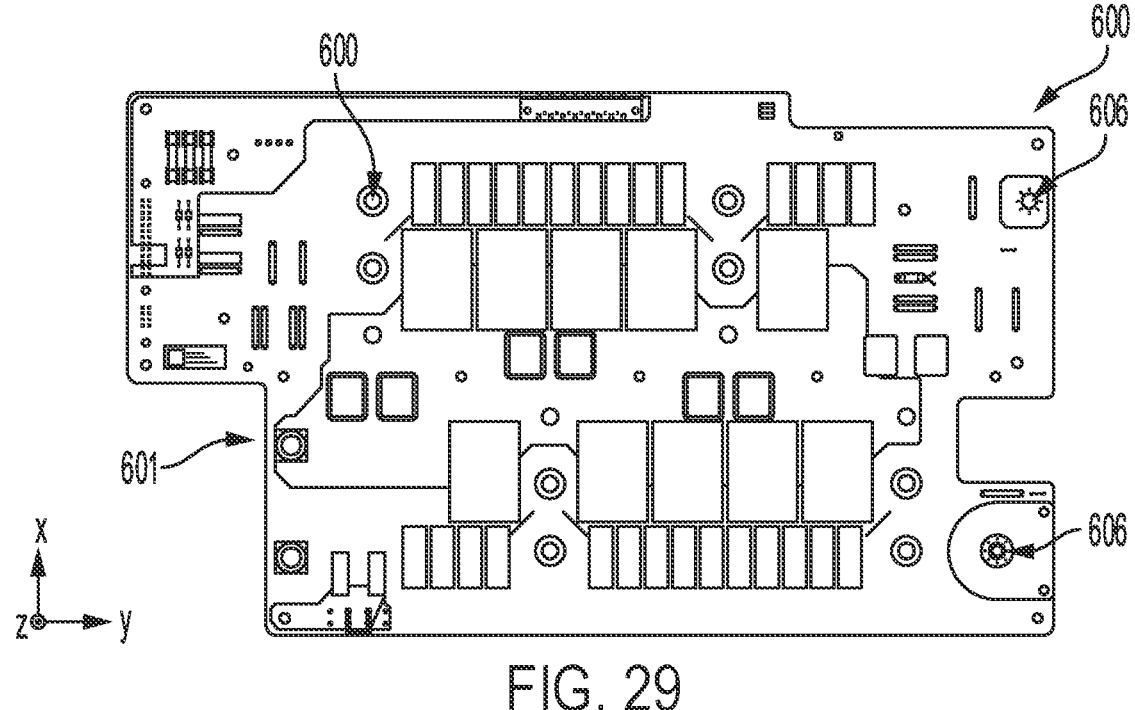
FIGS. 29-30 are top and bottom views, respectively, of the power board.
Figure 30:
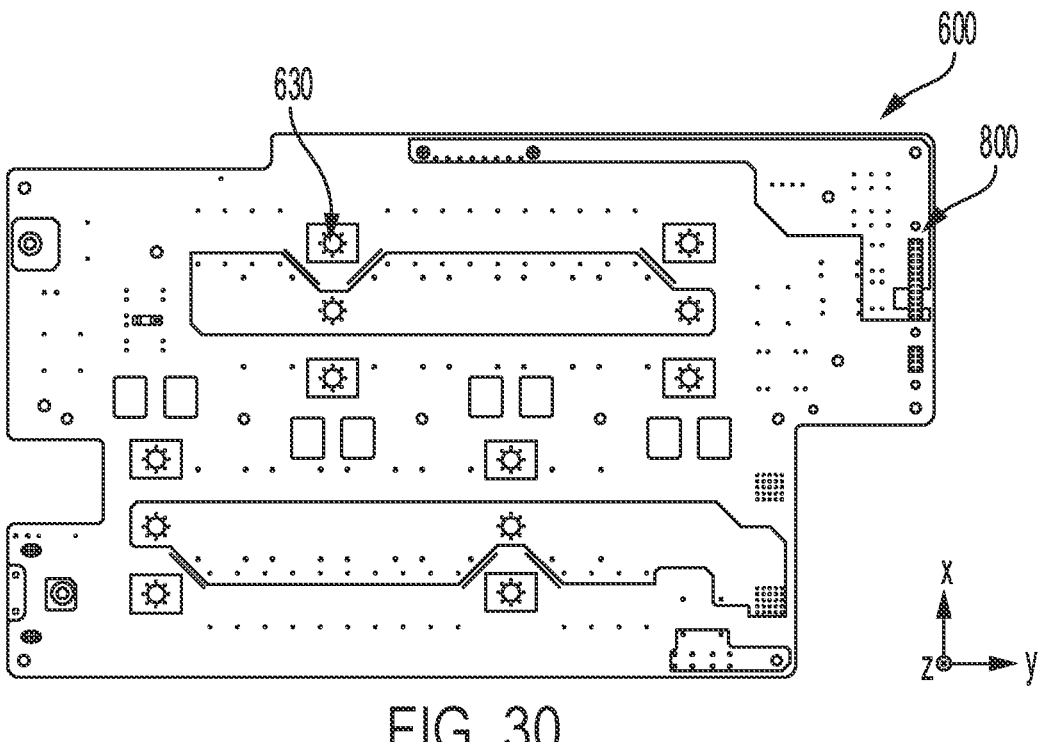
Figure 31:
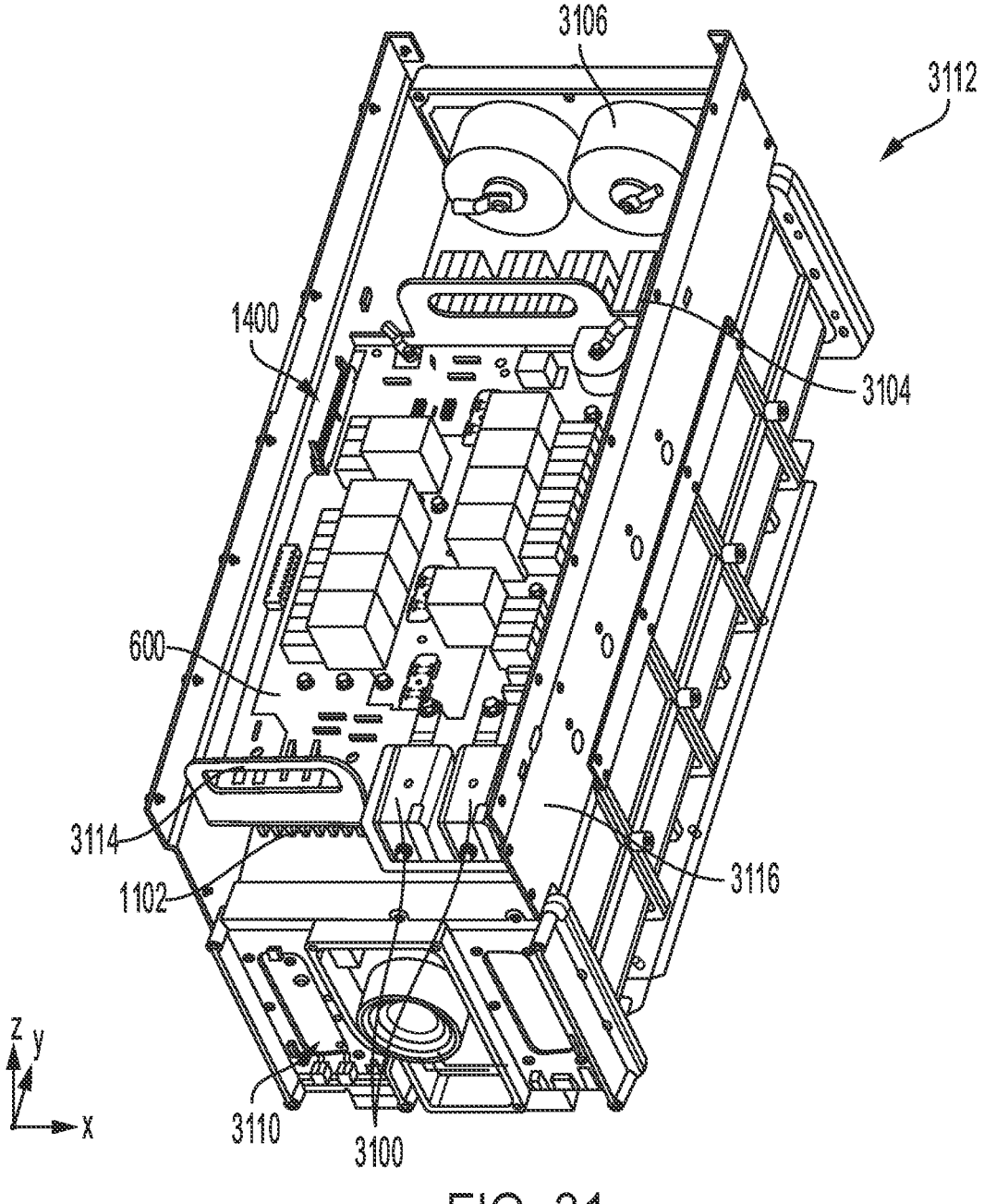
FIGS. 31-32 are views of a system where the power electronics assembly is coupled to a high voltage (HV) tank.
Figure 32:
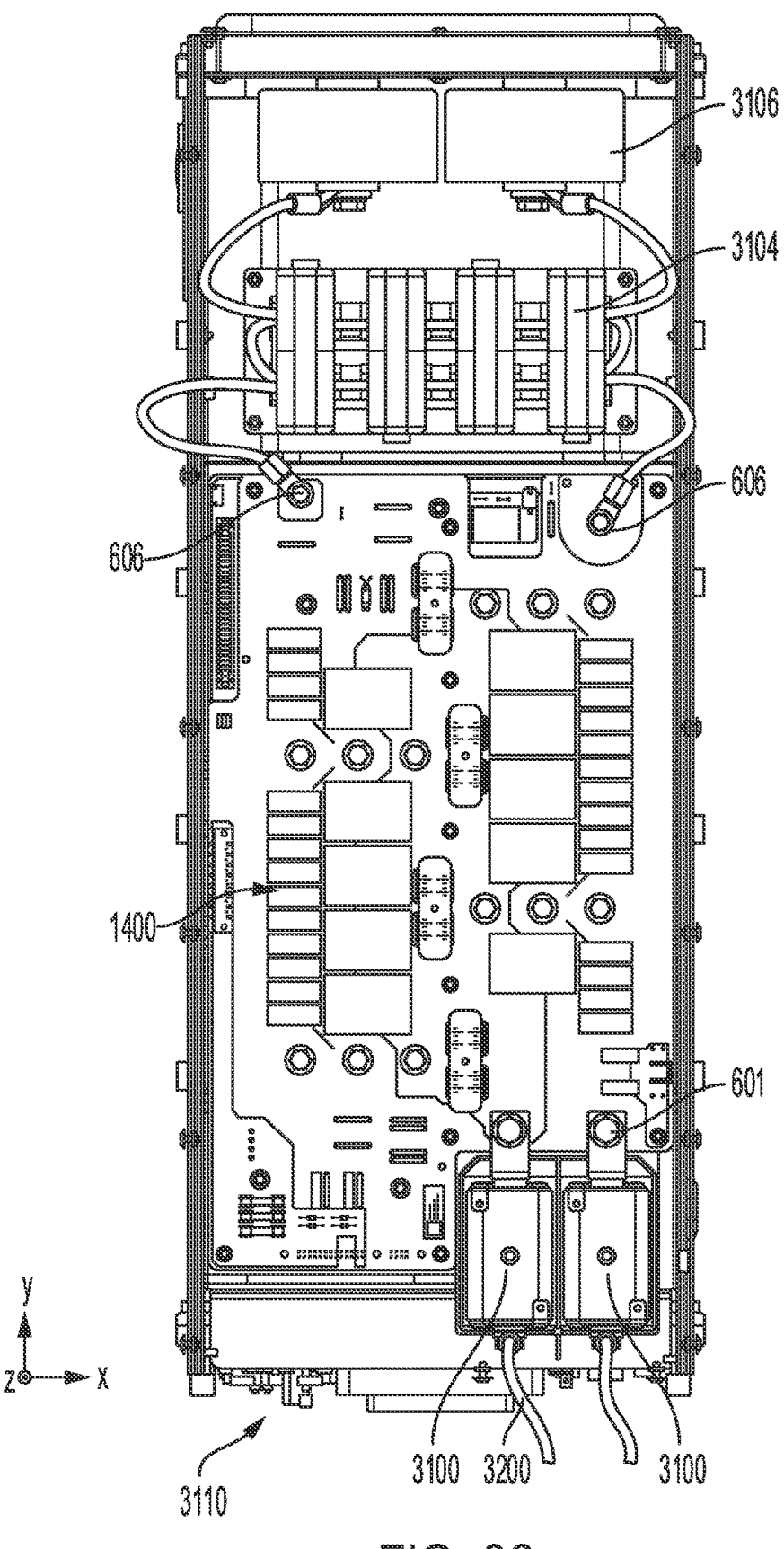

FIGS. 1-3 illustrate examples of imaging systems in which the power electronics assembly described herein may be integrated. However, the power electronics assembly may be used in a variety of systems where a space-efficient device is demanded. FIGS. 4-10 depict an exemplary space-efficient installation sequence of a gate board and a power board for a power electronic assembly. FIG. 11 shows a detailed view of power modules with terminals arranged centrally along a heat sink in the power electronics assembly to facilitate space-efficient packaging with the gate and power board assembly. FIG. 12 shows a detailed view of one of the power modules. FIG. 13 shows a detailed view of an insulated spacer which allows the boards in the assembly to be space efficiently stacked and achieve desired electronic connections. FIG. 14 illustrates a perspective view of the power electronics assembly with a stacked arrangement of the gate board, the power board, the power modules, and the heat sink, which achieves increased compactness when compared to inverters with vertically aligned gate driver boards. FIGS. 15-16 depict detailed views of the compact and robust electrical connection between the power modules and the power board. FIG. 17 shows a cross-sectional view of an insert between the boards in the assembly, which allows for desired spacing in the board stack. FIGS. 18-23 illustrate different views of interconnection boards which allows the gate board and the power modules to be space efficiently connected to the gate board. FIG. 24 shows a detailed view of one of the interconnection boards. FIGS. 25-26 show detailed views of the female connectors and the male connectors which form the electrical interfaces between the interconnection boards and the gate board as well as the power modules. FIGS. 27-28 show top and bottom views, respectively, of the gate board which has openings that allow for the power modules to compactly mate therewith. FIGS. 29-30 show top and bottom views, respectively, of the power board with openings for the terminals of the gate board and the power modules. FIGS. 31-32 show a system with the power electronics assembly space efficiently attached to a high voltage (HV) tank.

Prior to discussion of the power electronics assembly, FIGS. 1-3 provide an exemplary operating environment for the power electronics assembly described herein. However, while FIGS. 1-3 describe an X-ray system, the power electronics assembly described herein may be used in a variety of systems such as in the automotive and industrial application and in any operating environment in which a compact and reliable inverter is desired.

FIGS. 1 and 2 are schematic illustrations of an embodiment of a portion of an X-ray tube 12 coupled to an X-ray controller/power supply 38. The X-ray controller/power supply 38 may include a power electronics assembly 39 and a HV tank 41, which in conjunction supply the X-ray tube 12 with power, when desired. However, in other examples, the power electronics assembly may be incorporated into a gantry of a CT imaging system. In still other examples, the power electronics assembly has applicability in systems which demand DC to AC conversion in a compact space. Therefore, the power electronics assembly has use beyond the health care industry, such as in industrial applications, automotive applications, and the like. The X-ray tube 12 includes an electron beam source 60 and an anode assembly 64 including an anode 66. The electron beam source 60 and the anode 66 may be disposed within an enclosure such as a glass or metallic envelope. The X-ray tube 12 may be positioned within a casing which may be made of aluminum and lined with lead. In certain embodiments, the anode assembly 64 may include a rotor and a stator outside of the X-ray tube 12 at least partially surrounding the rotor for causing rotation of an anode 66 during operation.

The electron beam source 60 configured to receive electrical signals via a series of electrical leads 68 (e.g., coupled to a high voltage source) that cause emission of an electron beam 70. The anode 66 is configured to receive the electron beam 70 on a target surface 72 and to emit X-rays, as indicated by dashed lines 74, when impacted by the electron beam 70 as depicted in FIG. 1. The electrical signals may be timing/control signals (via the X-ray controller/power supply 38) that cause the electron beam source 60 to emit the electron beam 70 at one or more energies. Further, the electrical signals may at least partially control the potential between the electron beam source 60 and the anode 66. The voltage difference between the electron beam source 60 and the anode 66 may range from tens of thousands of volts to in excess of hundreds of thousands of volts. The anode 66 is coupled to the rotor via a shaft. Rotation of the anode 66 allows the electron beam 70 to constantly strike a different point on the anode perimeter. Within the enclosure of the X-ray tube 12, a vacuum of the order of $10^{-5}$ to about $10^{-9}$ torr at room temperature is preferably maintained to permit unperturbed transmission of the electron beam 70 between the electron beam source 60 and the anode 66.

FIG. 3 is a schematic diagram of an embodiment of the X-ray generator 300. The X-ray generator 300 includes the power electronics assembly 306 that receives electrical main power from a power distribution unit (PDU) 322. The PDU 322 provides the external input power to the power electronics assembly 306. In some examples, the PDU 322 provides power at an exemplary 50 Hz input frequency. The power electronics assembly 306 may include a frequency converter which produces a high frequency input power signal to the transformer assembly 312. The high frequency input power signal may have a frequency between 50 kHz to 350 kHz. The high frequency input power signal includes an AC component and a DC component to provide both the input voltage for the HV tank 304 to develop the high voltage potentials necessary to generate the X-rays. The power from the power electronics assembly is provided into the HV tank 304 and the transformer assembly 312 located therein.

As described above, the transformer assembly 312 and voltage rectifier 314 generate the high voltage potentials required by the X-ray tube to generate X-rays. Particularly, in dual energy (DE) or multiple energy (ME) X-ray applications, the transformer assembly 312 and voltage rectifier 314 are capable of generating multiple voltage levels across the X-ray tube 302. In some examples, one or more of the frequency converter, transformer assembly 312, and voltage rectifier 314 comprise a high voltage generator 318 of the X-ray generator 300. A filtering capacitor 324 is provided in parallel to the voltage rectifier 314. An output capacitor 326 is arranged in parallel to the X-ray tube 302 and controls the voltage applied across the X-ray tube 302 and stores potential for recapture and reuse. In embodiments, the capacitance of the output capacitor 326 may at least partly comprise the capacitance of a high voltage cable linking the high voltage generator and the X-ray tube. The capacitance of the output capacitor may be greater than that of the filtering capacitor 324.

As explained above, the dynamic damper 320 is located between the X-ray tube 302 and the voltage rectifier 314. A high impedance provided by dynamic damper 320 at these frequencies protects the system against the occurrence of tube-spit. However, a high damping impedance reduces the efficiency of energy recovery. Therefore, a dynamic damper 320 which produces a frequency-variable impedance can provide a low impedance at low frequencies associated with operation of the X-ray generator 300, including embodiments with energy storage systems as described herein while providing a high impedance when high frequency tube-spit phenomenon occurs. This arrangement achieves both improved tube-spit protection, as well as improved energy recovery, particularly in systems that use resonant switching.

Thus, the X-ray generator described above may include an X-ray tube including one or more emitters from which an electron beam is emitted toward a target. The emitter is a part of a cathode (e.g., cathode 308) and the target is an anode (e.g., anode 310), with the target at a substantially higher positive voltage (which may be at ground) than the emitter (which may be at a negative voltage). Electrons from the emitter may be formed into a beam and directed or focused by electrodes and/or magnets which are also parts of the cathode. In response to the electron beam impinging the target, the target emits X-rays. The voltage supplied to the electrodes of the cathode may be controlled in order to create X-ray pulses and adjust the intensity or energy of X-rays that are generated. In these systems, with respect to controlling the emitter, it may be desirable to be able to produce fast transitions from low to high voltages, as well as to control voltage waveforms on electrodes voltage values to control the electron beam. Further, the high voltage generator (e.g., the HV tank 304) may be turned off between X-ray pulses and turned on a predefined amount of time before an X-ray pulse is commanded to begin (e.g., 1 ms) which may allow the high voltage generator to reach a threshold voltage necessary for initiating the X-ray pulse. The architecture of the X-ray tube shown in FIG. 3 is exemplary in nature and the imaging systems and specifically the power electronics unit described herein may be used with an X-ray tube or other suitable device which receives power from the unit.

FIGS. 4-7 show an assembly sequence between a gate board 400 and a power board 600 in a power electronics assembly which is expanded upon in greater detail herein. The assembly sequence allows the boards and other components in the power electronics assembly to be quickly and space efficiently installed.

Figure 4:
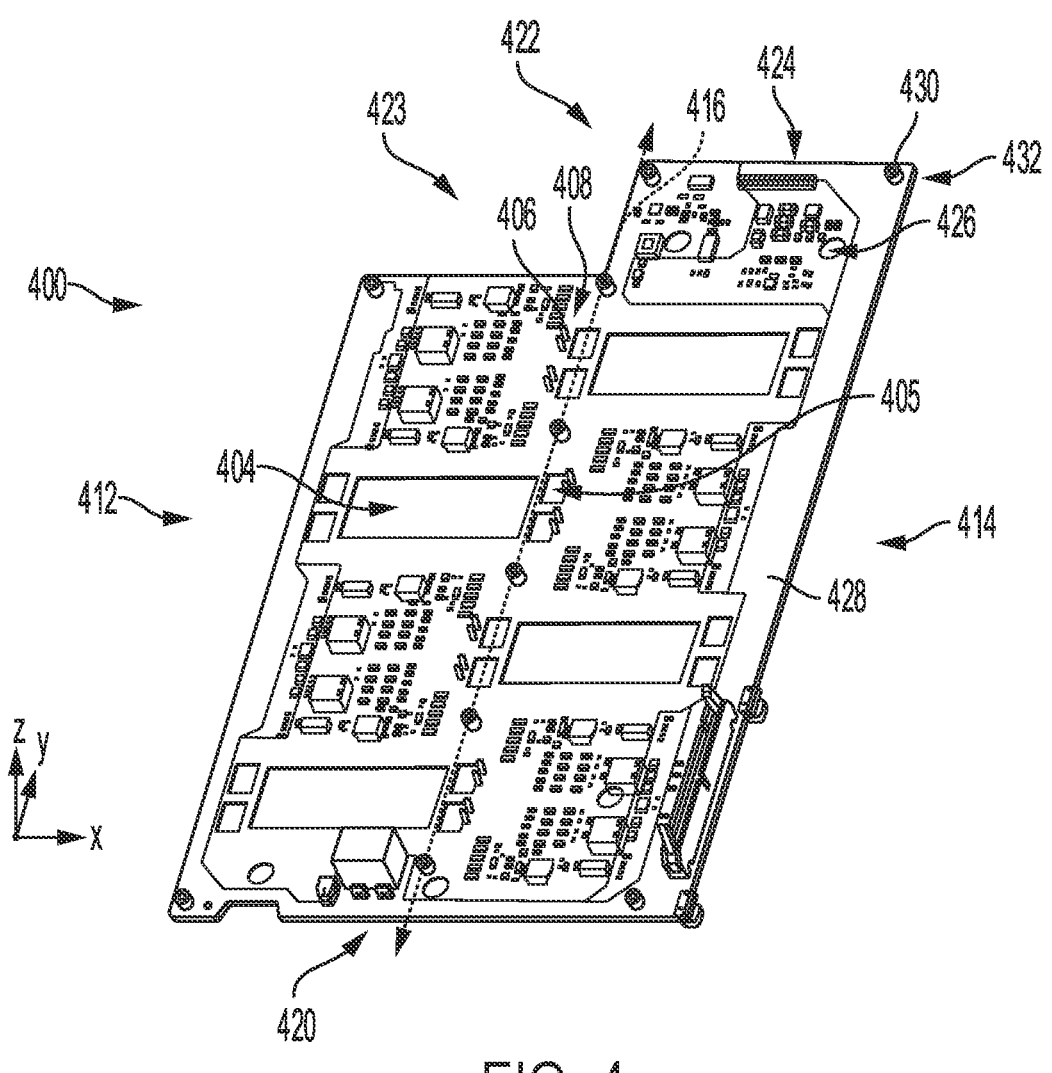
FIGS. 4-10 are detailed illustrations of an assembly sequence for a gate board and a power board in a power electronics assembly.

Specifically, FIG. 4 shows a top view of the gate board 400 with module openings 404 which allow power modules, which are elaborated upon herein, to mate therewith and extend there through. To expound, the module openings 404 allow power terminals in the power modules to extend there through and attach to a power board, discussed in greater detail below. The gate board 400 further includes control terminal openings 405 (e.g., control terminal slots), in the illustrated example. The control terminal openings 405 allow control terminals (e.g., male control terminals in the power modules which are discussed in greater detail herein) to extend there through. These openings in the gate board allow the power electronic assembly's space efficiency to be increased by allowing the modules mate therewith and the assembly to form a compact stack of boards.

The gate board 400 further includes gate board terminals 406 which be clustered in terminal sets 408 each of which are positioned adjacent to a corresponding set of control terminals for power modules which are discussed in greater detail below in reference to FIG. 11. Specifically, in the illustrated example, the number of sets of terminals is equal to the number of power modules in the power electronics assembly. However, other terminal clustering configurations have been contemplated. The terminals described herein generally serve electrical interfaces and may take a variety of suitable forms which enable electrical connections between desired components. Specifically, in the illustrated example, the gate board terminals 406 are illustrated as male pins which have a desired vertical height for space-efficient attachment to interconnection boards, which are expanded upon herein with regard to FIGS. 21-26.

The gate board terminals 406 are positioned centrally along the gate board in relation to an x-axis included in a coordinate system elaborated upon herein, such that the terminals are spaced away from a first lateral side 412 and a second lateral side 414 of the gate board 400. In particular, the gate board terminals 406 may be centrally located but slightly offset along a centerline 416 (e.g., a longitudinal centerline), which allows for terminals in power modules, which are expanded upon herein. The gate board 400 may further include an AC side 420 (e.g., an HV tank side) and an DC supply side 422. The DC side 422 may include a cut-out 423 which enables fuses to be attached to a DC bus electrical interface 601 (e.g., DC bus terminals) in the power board, shown in FIG. 6, to be attached thereto. However, other board layouts have been contemplated.

As depicted in FIG. 4, the gate board 400 further includes an electrical interface 424 (which is formed as a surface mount socket, in the illustrated example). The electrical interface 424 is electrically coupled to an electrical interface (e.g., a press-fit header terminal) in a power board in the power electronics assembly. In this way, the gate board 400 is able to be space efficiently connected to the power board.

The gate board 400 further includes holes 426 which are sized and positioned to allow threaded interfaces (e.g., stand-offs) to pass through the gate board. These threaded interfaces are discussed in greater detail herein in regard to FIGS. 11, 13, and 17.

The coordinate axis system is provided in FIG. 4 as well as FIGS. 5-32, when appropriate, for reference. The x-axis may be referred to as a lateral axis, the y-axis may be referred to as a longitudinal axis, and the z-axis may be referred to a vertical axis to provide a common frame of reference for the components in the power electronics assembly. However, the assembly may be arranged in a variety of orientations when installed in its end-use system. As such, the vertical axis may or may not be parallel to a gravitational axis when the assembly is installed in its end use system, in some instances. The specific orientation of the assembly in its operating environment may be dictated based on the spatial constraints of the end-use system, expected heat distribution in the system, and/or other factors.

The gate board 400 includes a substrate 428 with the electronic componentry incorporated therein and/or coupled thereto. The substrate 428 is arranged parallel to the x-y plane in the illustrated example. Therefore, the arrangement of the substrate 428 and the gate board 400 more generally may be in a horizontal plane. The other boards in the assembly may be arranged horizontally in the same manner, which allows the boards to be space efficiently stacked when the assembly is formed during manufacturing.

The substrate 428 of the gate board 400 forms a continuous structure in the illustrated example. In this way, the gate board 400 may be manipulated as a monolithic unit during installation and repair. Spacers 430 (e.g., threaded standoffs) are further included in the gate board 400 in the illustrated example. The spacers 430 may specifically be press-fit into the gate board and may include interior threads. The spacers 430 allow the boards in the assembly to exhibit a targeted vertical separation in the power electronics assembly and may be positioned adjacent to the corners 432 of the gate board. However, the spacers may be arranged in other suitable locations in alternate embodiments.

Figure 5:
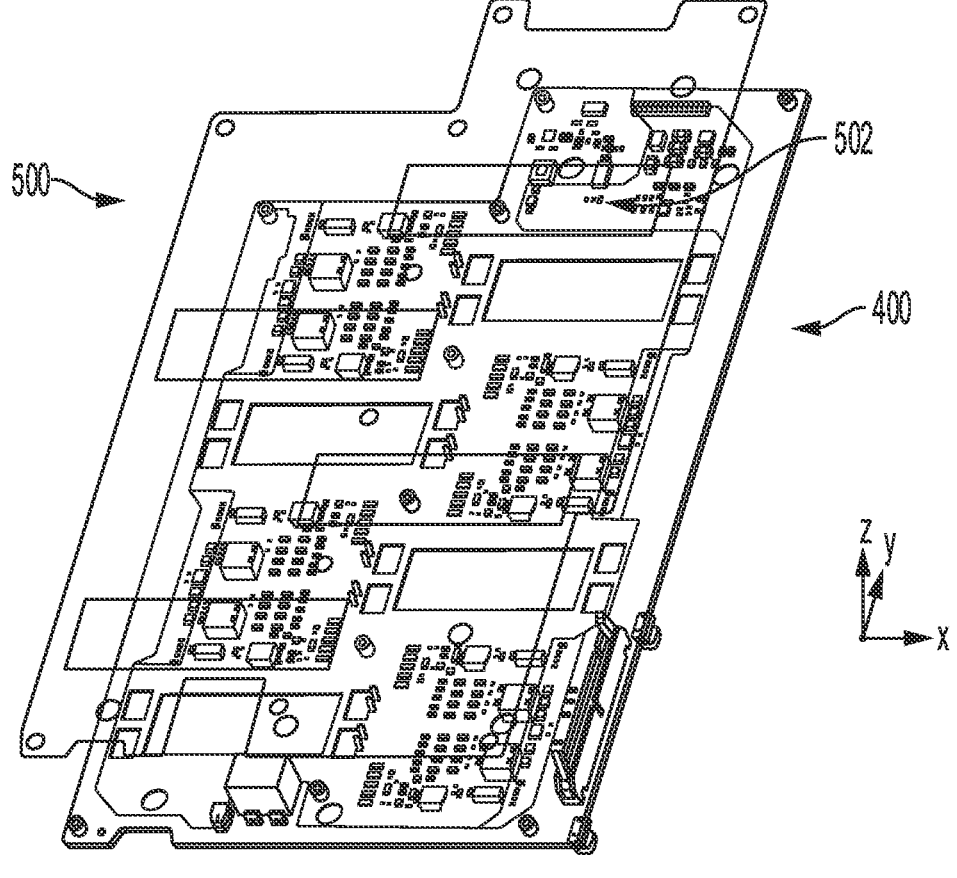

FIG. 5 shows an insulating sheet 500 that may be placed on top of the gate board 400 during the assembly. The insulating sheet 500 provide voltage insulation between the boards. The insulating sheet 500 may have 5.5-7.5 kilovolts (kV) dielectric strength, in one use-case example. However, the insulating sheet may be constructed with other suitable thicknesses and dielectric strengths that may be selected based on the electronic construction of the boards, the expected conditions in the assembly's operating environment, and the like. The insulating sheet 500 includes openings 502 which allow the terminals in the power modules and other terminals to extend there through to allow the gate board and the power board to be compactly stacked.

Figure 6:
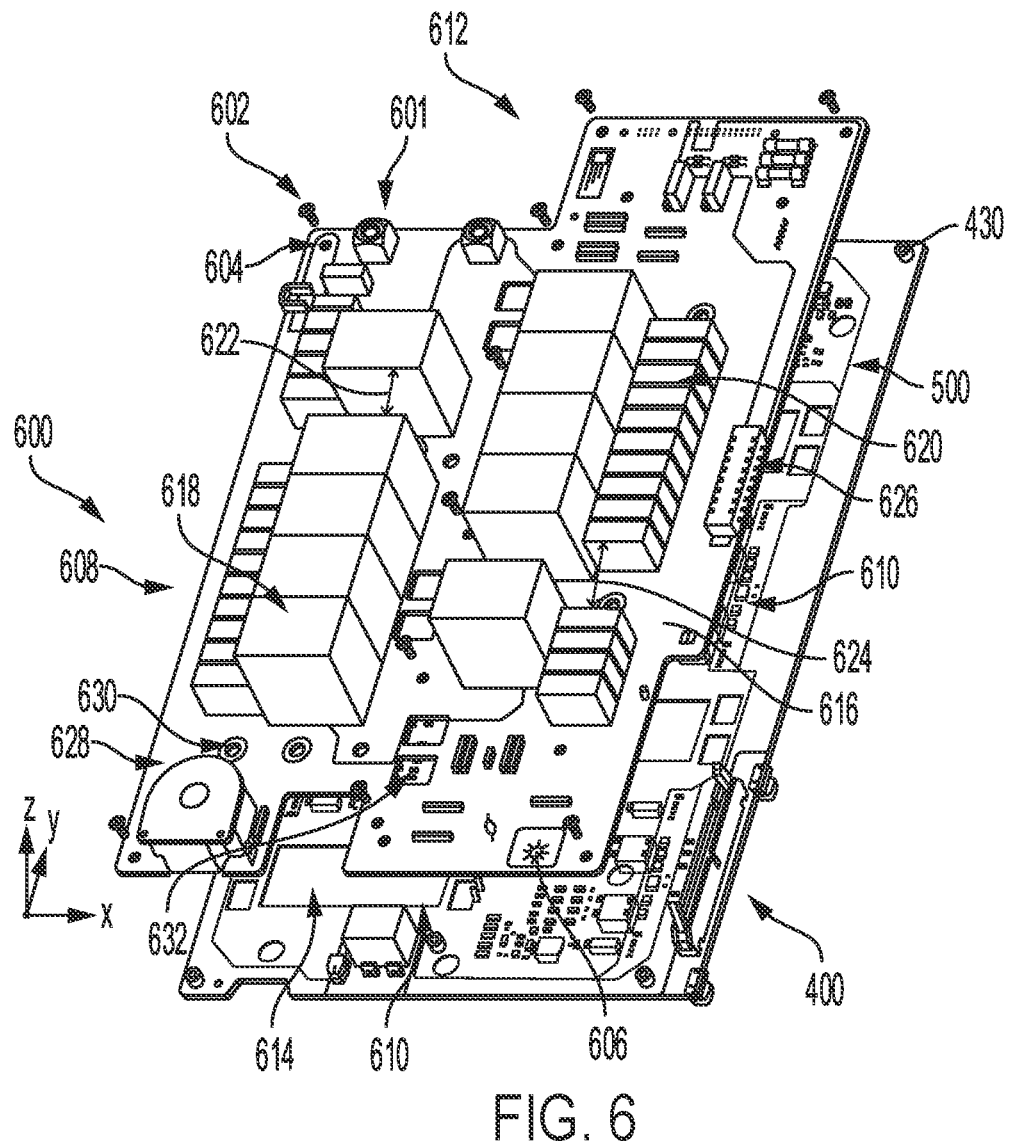

FIG. 6 shows a power board 600 placed on top of the insulating sheet 500 as part of an assembly process of the power electronics assembly. To elaborate, a sequential stack is formed between the power board 600, the insulating sheet 500, and the gate board 400. Attachment devices 602 (e.g., screws, bolts, and the like) are further shown in FIG. 6, which may be used to removably attach the power board 600 to the gate board 400. When assembled, the attachment devices 602 extend through holes 604 and thread into the spacers 430 (e.g., press-fit threaded stand-offs).

The power board 600 includes the DC bus electrical interface 601 (e.g., DC bus terminals) in the illustrated example. The DC bus electrical interface 601 may be electrically coupled to fuses 3100 (shown in FIG. 31) which may be used as the inverter's input connection. The fuses 3100 function to isolate the inverter and protect the main fuse and circuit breaker in the case of inverter inoperability (e.g., short circuit degradation). As shown in FIG. 32, DC bus wires 3200 and/or other suitable electrical connectors may be used to connect the fuses 3100 to DC supply output capacitors. In turn, the DC supply output capacitors may be designed to store energy as well as open the fuses 3100 in case of an inverter short circuit even with a long cable between the DC supply capacitors and the inverter.

FIG. 6 further shows electrical connectors 606 on the power board 600, which may be designed to electrically couple to resonant choke assemblies 3104 (shown in FIG. 31) which in turn may be electrically coupled to resonant capacitors 3106.

As illustrated in FIG. 6, the power board 600 includes a first lateral side 608, a second lateral side 610, an DC supply side 612, and an AC side 614 (e.g., a HV tank side). The power board 600 includes a substrate 616. The substrate 616 may be arranged in a horizontal plane (parallel to the x-y plane), as indicated above. The horizontal arrangement of the boards allows for space-efficient packaging of the components in the power electronics assembly when compared to inverters with multiple vertically aligned gate driver boards, for instance.

DC decoupling capacitors 618 and snubbers 620 are further coupled to the substrate, in the illustrated example. Gaps 622 and 624 may be provided between the components 618 and 620, respectively, to allow for bolts or other suitable attachment devices to provide a robust electrical connection between the power board and the power modules. This connection is expanded upon herein with regard to FIGS. 14-16.

A ground device 624 may further be included in the power board 600 along with a fan connector 626. The ground device 624 may be positioned on the lateral side 608 of the board and the fan connector 626 may be positioned on the other lateral side 610 of the board. The power board 600 may further include a current sensor 628. However, the power board may have other component configurations, in alternate embodiments.

FIG. 6 further shows openings 630 for attachment devices that electrically couple power modules to the power board 600 are further illustrated in FIG. 6. This electrical interface between the attachment devices and the power board is discussed in greater detail herein. The power board 600 further includes opening 632 which facilitates the attachment of the interconnection boards to the gate board and the power modules, which is discussed in greater detail herein. As such, the openings 632 may be referred to as interconnection board openings.

Figure 7:
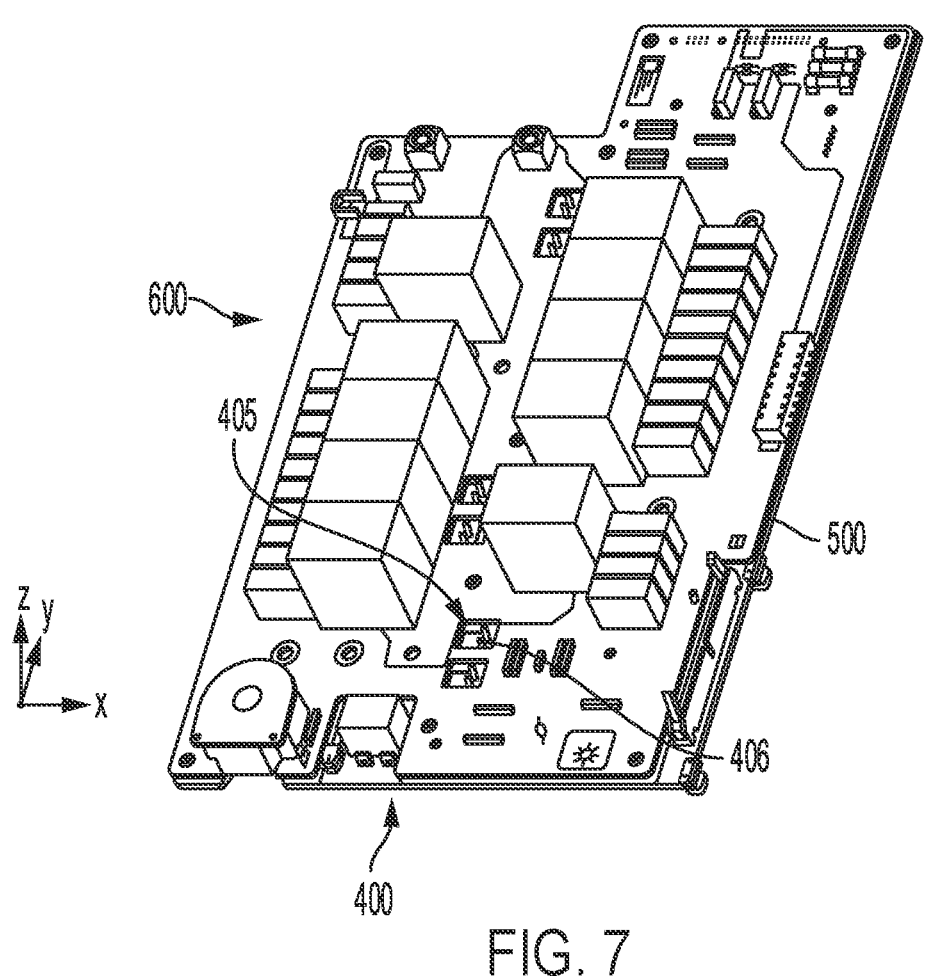

FIG. 7 shows the attachment devices 602 threaded into the spacers 430 (shown in FIG. 6) to enable removable attachment between the power board 600, the insulating sheet 500, and the gate board 400. In this way, the power board 600 is removably coupled to the gate board 400. The terminals 406 (e.g., male terminals) in the gate board 400 are shown extending through the terminal openings 405 in the power board. In this way, the terminals 406 are able to attach to interconnection boards which are expanded upon herein in regard to FIGS. 18-16. Additionally, FIG. 7 shows the gate board 400, the insulating sheet 500, and the power board 600 forming an assembled stack. These components may be horizontally arranged in planes that are parallel to the x-y plane and therefore are stacked along an axis that extends perpendicularly to the planes, which is discussed in greater detail herein. By including the insulating sheet 500 between the power board 600 and the gate board 400, the power board 600 may be advantageously positioned closer to the gate board 400 than in alternate systems not including the insulating sheet 500, without generating voltage insulation between the power board 600 and the gate board 400.

Figure 8:
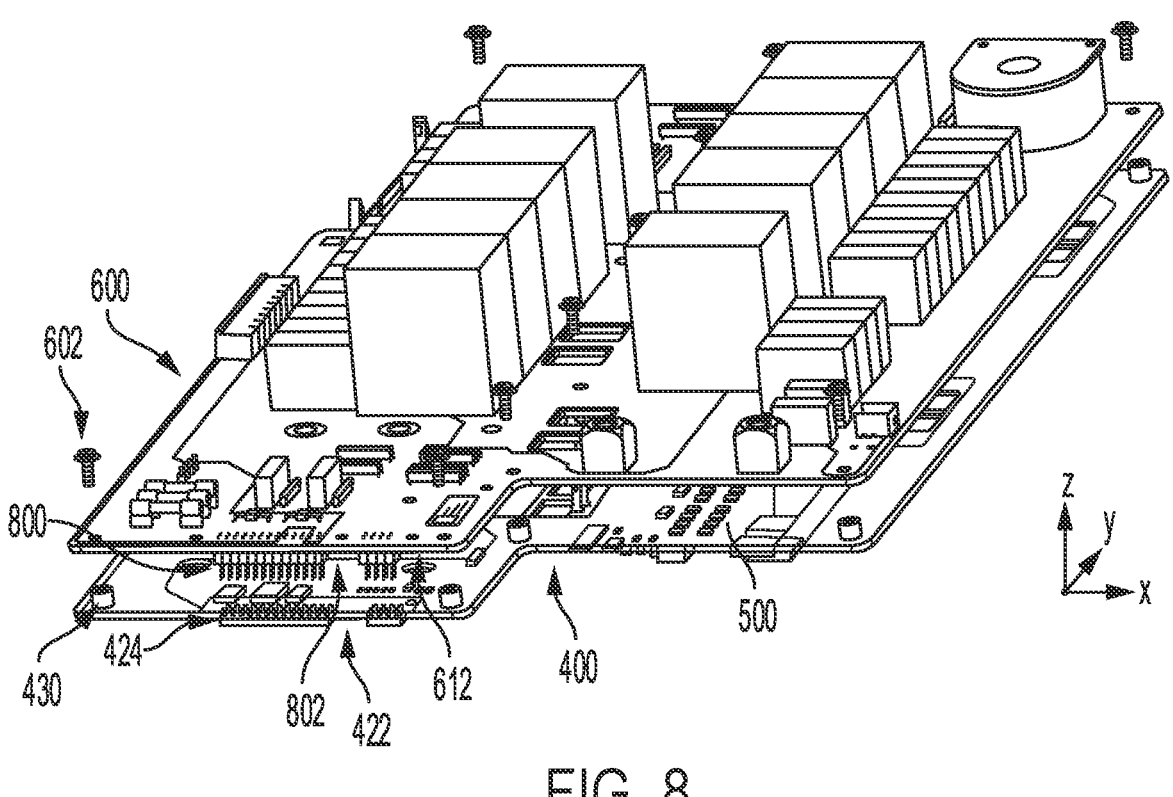
Figure 9:
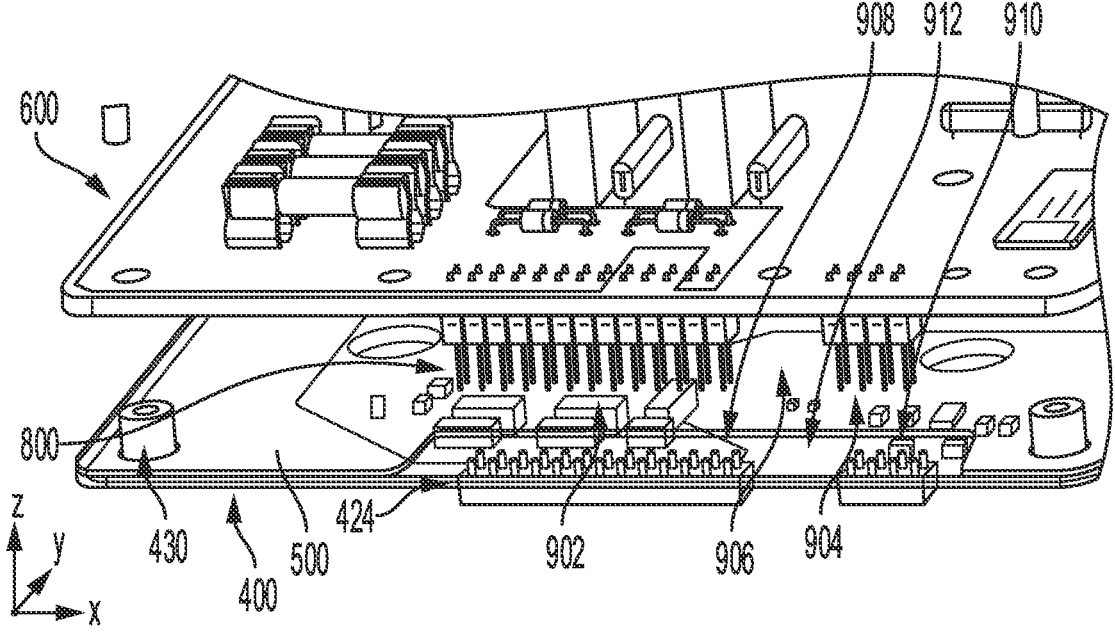
Figure 10:
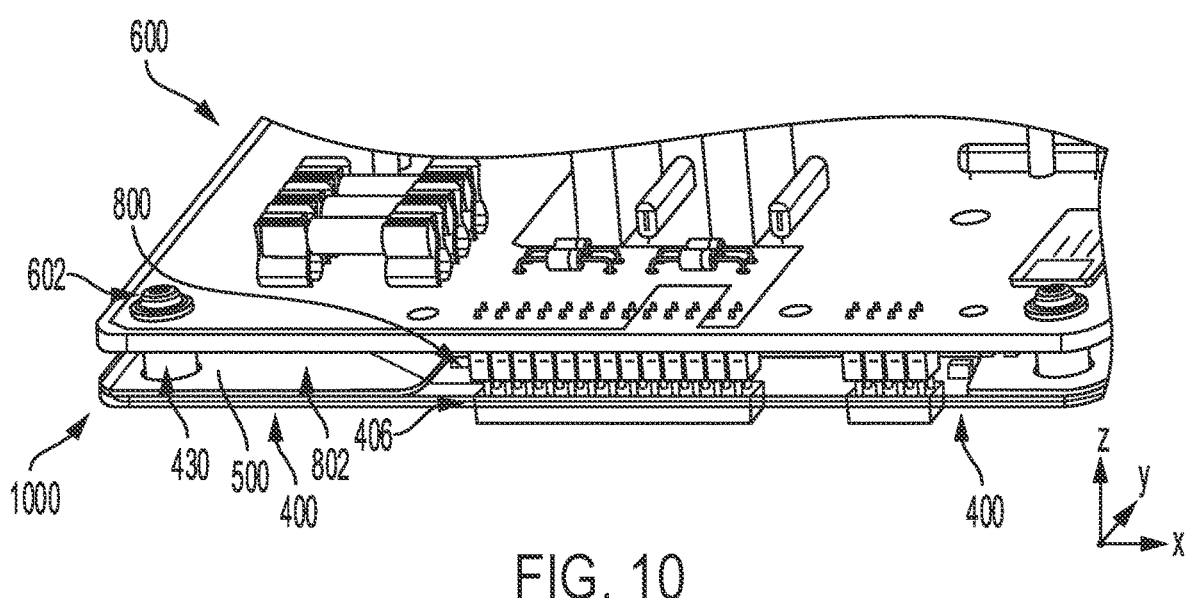

FIGS. 8-10 show an assembly sequence where the electrical interface 424 in the gate board 400 is mated with an electrical interface 800 which is included in the power board 600 and extend from a bottom side 802 of the board. To expound, the electrical interface 800 is depicted as a press-fit header terminal which mates with a surface mount socket, in the illustrated example. However, a variety of suitable electrical interfaces which form a connection between the gate board and the power board are possible. In this way, a direct electrical connection is established between the power board 600 and the gate board 400, thereby increasing the system's space efficiency when compared to boards that are indirectly coupled to one another. The mated electrical interfaces 800 and 424 are positioned on the DC sides 612 and 422 of both the power board 600 and the gate board 400 of the assembly, in the illustrated example. However, other mated interface positions are possible. The insulating sheet 500 is further depicted in FIGS. 8-10. The spacers 430 are further illustrated in FIGS. 8-10.

As depicted in FIG. 9, the electrical interface 800 may be demarcated into sections 902 and 904 which have a gap 906 there between, in one example. However, other electrical interface configurations have been contemplated such as a configuration where the interface forms a continuous interface without a gap. Similarly, the electrical interface 424 may be demarcated into sections 908 and 910 which have a gap 912 there between, in one example.

FIG. 10 further depicts the attachment devices 602 threaded into the spacers 430 in the gate board 400. In this way, the power board 600 is removably attached to the gate board 400 with a desired spacing between the boards. To elaborate, the attachment devices 602 may be coupled to the spacers 430 (e.g., threaded standoffs) adjacent to corners 1000 of the gate board 400 and the power board 600.

FIG. 11 shows power modules 1100 (e.g., insulated gate bipolar transistor (IGBT) power modules) coupled to a heat sink 1102 that may be included in the power electronics assembly. The power modules 1100 include control terminals 1104 and power terminals 1106.

The heat sink 1102 includes an upper surface 1108 which is planar in the illustrated example. The upper surface 1108 may be arranged horizontally and therefore be parallel to the x-y plane. The heat sink 1102 further includes heat fins 1110 on a lower side 1112 which extend downwards and include gaps 1114 between the fins to facilitate effective cooling. Side pieces 1116 may be coupled to the lateral sides 1118 and 1120 of the heat sink 1102. Spacers 1122 are coupled to the upper surface 1108 of the heat sink 1102. To expound, the spacers 1122 may include extensions 1302 (e.g., which may be threaded), shown in FIG. 13, and discussed in greater detail herein, which mate with recesses 1124 in the heat sink.

Continuing with FIG. 11, control terminals 1104 in the power modules 1100 may be aligned along the centerline 416 to enable quick and space-efficient attachment between the control terminals and interconnection boards by compactly grouping the control terminals together, which are discussed in greater detail herein. To elaborate, the control terminals as centrally arranged and spaced away from lateral sides 1118 and 1120 of the heat sink 1102. Thus, the control terminals 1104 may be positioned at inner sides 1126 of the power modules 1100. Outer sides 1128 of the power terminals may be positioned adjacent to the lateral sides 1118 and 1120 of the heat sink 1102. To expound, a portion of the power modules 1100 may be positioned adjacent to the lateral side 1118 of the heat sink 1102 and another portion of the power modules may be positioned adjacent to the other lateral side 1120 of the heat sink. The two portions of the power modules 1100 may be staggered along the centerline 416 to allow the control terminals 1104 to be centrally aligned and space efficiently attached to the interconnection boards which are discussed in greater detail herein.

Attachment devices 1130 (e.g., bolts, screws, combinations thereof, and the like) may be used to removably attach the power modules 1100 to the heat sink 1102. To elaborate, the attachment device 1130 may be arranged on the corners 1132 of the power modules 1100, in one specific example. The control terminals 1104 may be arranged longitudinally between a portion of the attachment devices 1130. Lock washers 1134 may also be used to attach the power modules to the heat sink 1102 to allow forces to be more evenly distributed.

The spacers 1122 may further be coupled to the heat sink 1102 on its upper side 1135, as discussed above. The spaces 1122 may include threaded inserts 1136. The threaded inserts 1136 may be constructed out of brass, in one example. However, the inserts may be constructed out of other suitable materials, in other examples.

An axis 1150 which is normal to the upper surface 1108 of the heat sink 1102 is depicted in FIG. 11 for reference. The assembly of the gate board 400 and the power board 600, shown in FIGS. 8-10 may be stacked along the axis 1150. To elaborate, the substrates of the boards may be arranged normal to the axis 1150. Consequently, the boards and power modules achieve increased space efficiency. Further, the axis 1150 is parallel to the z-axis in the illustrated embodiment.

FIG. 12 shows a detailed view of one of the power modules 1100 with a thermal interface material (TIM) 1200 arranged on a bottom side 1202 of the power module. Thus, the TIM 1200 is in face sharing contact with the heat sink 1102, shown in FIG. 11, when the power module is attached to the heat sink, once assembled. In this way, a greater amount of heat is able to be transferred from the power modules to the heat sink when compared to other power module arrangements, thereby decreasing the chance of thermal degradation of the power modules and increasing the efficiency of the power electronics assembly. The TIM 1200 may be deposited or otherwise directly attached to the power module 1100. The TIM may extend to a periphery of the power module to increase heat transfer from the power modules to the heat sink. However, other TIM contours are possible. The TIM may include a lower surface 1204 which may be planar which allows for increased heat transfer from the power modules to the heat sink. The power module 1100 may include recesses 1206 which allow for the attachment device 1130, shown in FIG. 11, to space efficiently attach the modules to the heat sink.

FIG. 13 shows a detailed view of one of the spacers 1122 which includes the threaded insert 1136 surrounded by an insulation layer 1301. The spacer 1122 further includes the extension 1302 which mates with an opening in the heat sink. The spacer 1122 may have planar sides 1304 on the insulated layer which may be polygonally arranged. In other examples, the insulated layer may have a curved (e.g., circular, elliptical, and the like) outer surface. The insulated layer may be constructed at least partially out of a polymer such as a polyamide, in one specific use-case example.

FIG. 14 shows a power electronics assembly 1400 with the gate board 400, the power board 600, and the heat sink 1102. To elaborate, the gate board 400, the power board 600, and the heat sink 1102 are sequentially arranged to form a stack, in the illustrated example. To expound, the power board 600, the gate board 400, and the heat sink 1102 may be aligned along the axis 1150 which is normal to the upper surface 1108 of the heat sink 1102, as previously discussed.

The control terminals 1104 and the terminals 406 in the gate board 400 are shown extending through the openings 632 in the power board 600. These terminals are electrically connected via interconnection boards which are expanded upon herein with regard to FIGS. 18-24.

Attachment device 1402 (e.g., bolts, screws, and the like) which electrically connect the power board 600 and the power terminals in the power modules (which are hidden from view in FIG. 14) are included in the power electronics assembly 1400 in the illustrated example. Each of the sets 1403 of attachment devices 1402 which attach the power modules to the power board 600 may be arranged along axes 1404 (e.g., lateral axes) which are parallel to the x-axis. Cutting plane A-A' denotes the cross-sectional view shown in FIGS. 14-16 and cutting plane B-B' denotes the cross-sectional view depicted in FIG. 17.

The DC bus interface 601 and the electrical connectors 606 as shown in FIG. 14. Additionally, the components 618 and 620 are again illustrated in FIG. 14. FIG. 14 further shows the fins 1110 of the heat sink 1102 which extend downward to enable the assembly to achieve increased cooling and therefore operate more efficiently.

FIG. 15 shows a cross-sectional view of the power electronics assembly 1400. The power board 600, the gate board 400, and the heat sink 1102 are again shown in FIG. 15. FIG. 15 further shows the attachment devices 1402 which extend through openings in the power board 600 and mate with power terminals 1500 in the power modules 1100.

FIG. 15 shows the stack formed between the power board 600, the gate board 400, the power modules 1100, and the heat sink 1102. To elaborate, the heat sink 1102 may form the bottom layer of the stack on which the power modules 1100 may be formed. Continuing up the stack, the gate board 400 and the power modules 1100 are arranged therein which include space-efficient contouring for forming various electrical connections between the power modules 1100, the gate board 400, and the power board 600 which are further expanded upon herein.

FIG. 16 shows a detailed view of the connection between the attachment device 1402 and the power modules 1100 in the power electronics assembly 1400. To elaborate, the attachment device 1402 are electrically connected to conductive metallized surfaces 1600 which are arranged on the bottom side 802 of the power board 600. In this way, the power modules are space efficiently electrically coupled to the power board. However, in other examples, the conductive metallized surfaces may be arranged on a top surface of the power board. The attachment devices 1402 includes heads 1602 with flanges 1604 which are in face sharing contact with the upper surface 1606 of the power board 600. The attachment devices 1402 further includes shanks 1608 which mate (e.g., thread into) the power terminals 1106 in the power modules 1100. The gate board 400 is further depicted in FIG. 16.

FIG. 17 shows a detailed view of the connection between one of the spacers 1122, the heat sink 1102, and the power board 600. To expound, an attachment device 1700 is threadingly engaged with the threaded interface 1336 in the spacers 1122, in the illustrated example. Further, the extension 1302 in the spacers 1122 is threaded into a threaded hole 1702 in the heat sink 1102, in the illustrated example.

Figure 18:
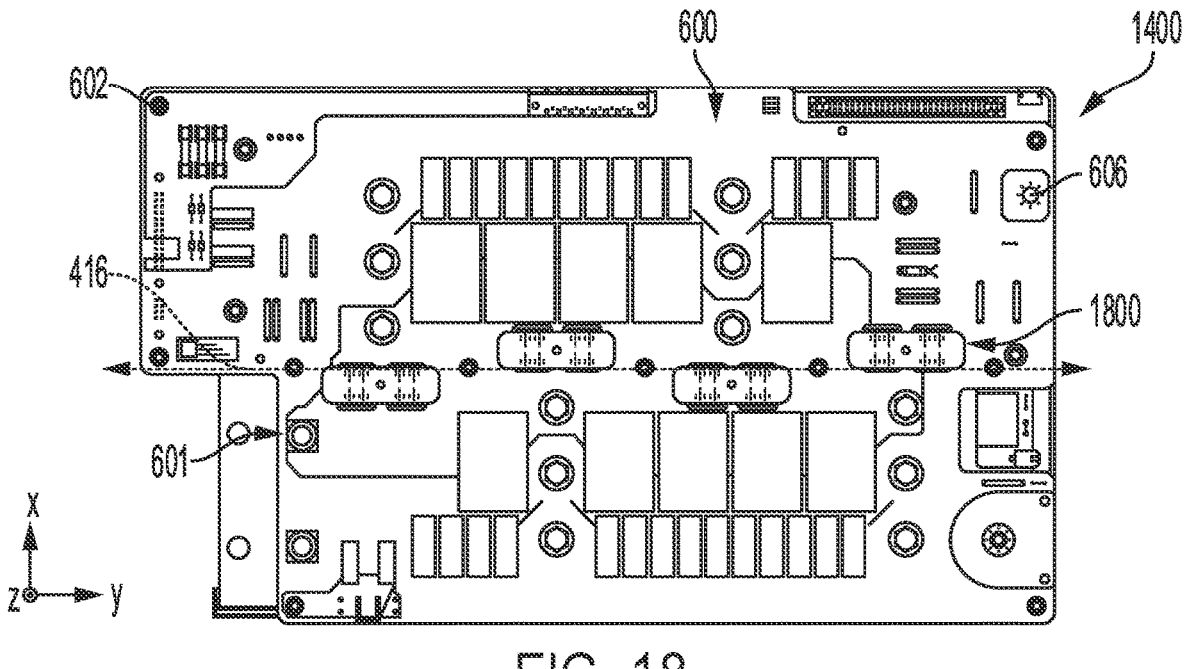
FIG. 18 is a top view of the power electronics assembly, depicted in FIG. 14, with interconnection boards.

FIG. 18 shows a top view of the power electronics assembly 1400 with interconnection boards 1800 that are electrically coupled to the control terminals 1104 in the power modules and male terminals 406 in the gate board 400, shown in FIG. 14. As depicted in FIG. 16, the interconnection boards 1800 may be arranged along the centerline 416 of the assembly. In this way, the electrical connection between the gate board 400, the power modules 1100, and the interconnection boards 1800 is compactly formed.

The DC bus interface 601 and the electrical connectors 606 are again illustrated in FIG. 18. Further, the attachment devices 602 which allow for removable attachment between the gate board and the power board 600.

Figure 19:
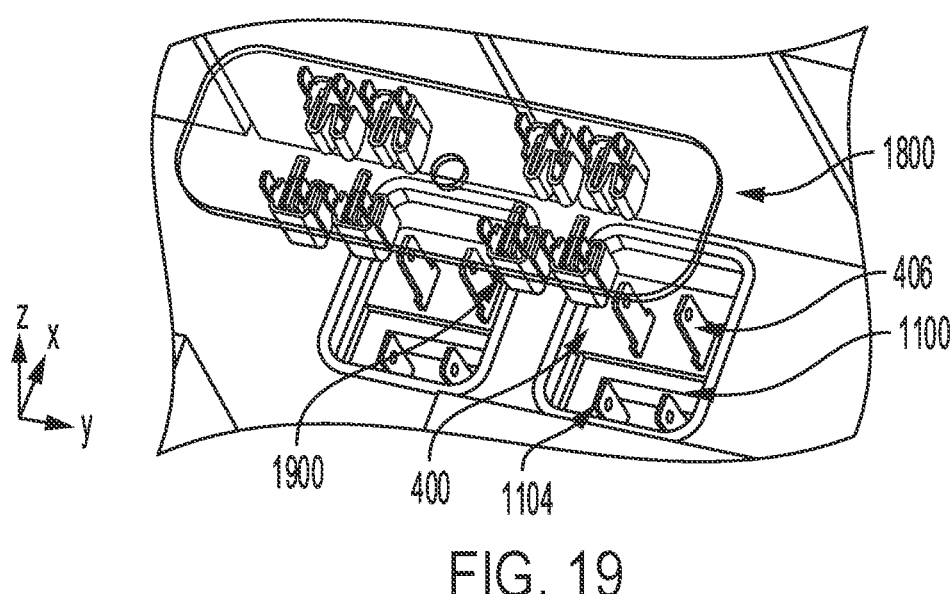
FIG. 19 is an exploded view of the connection between one of the interconnection boards, the gate board, and one of the power modules.

FIG. 19 shows the male terminals 406 in the gate board 400 and the control terminals 1104 in the power modules 1100 which are positioned and contoured to mate with female clips 1900 in the interconnection boards 1800.

Figure 20:
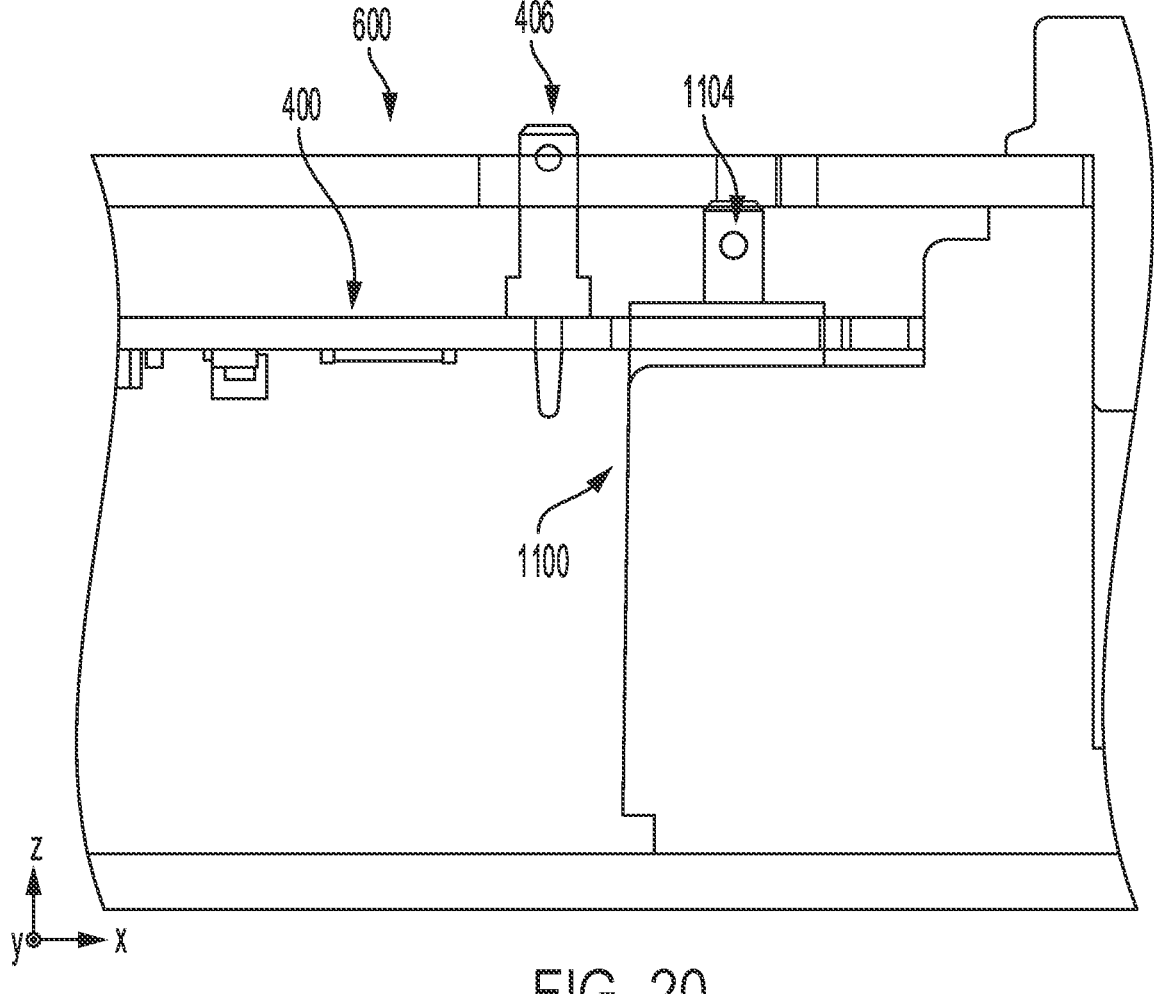
FIG. 20 is a side view of the power electronics assembly with the interconnection board removed.

FIG. 20 shows a detailed side view of the male terminals 406 in the gate board 400 and the control terminals 1104 in the power modules 1100, prior to installation of the interconnection board. As shown, the terminals 406 extend vertically through the power board 600.

Figure 21:
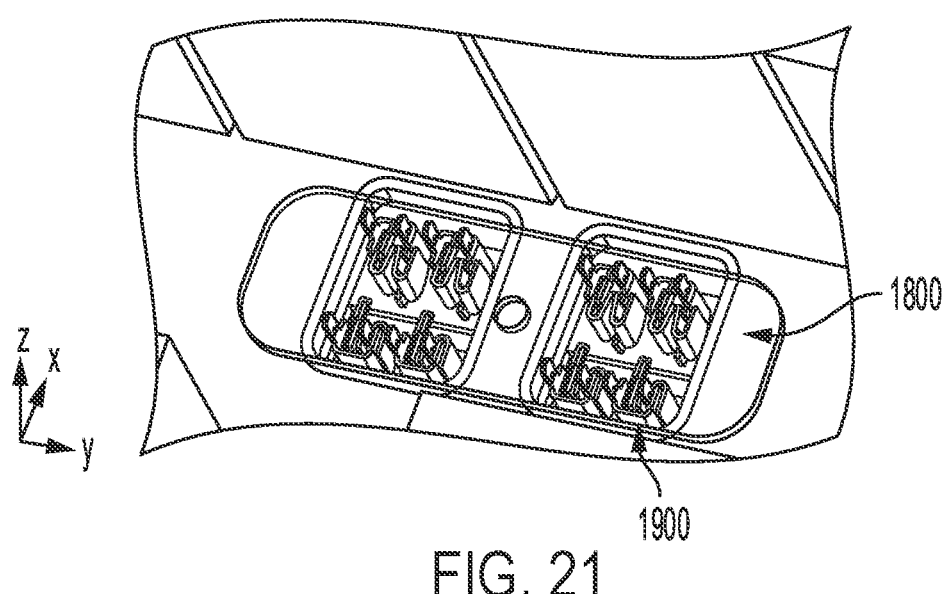
FIG. 21 is an assembled view of the connection between one of the interconnection boards, the gate board, and one of the power modules.

FIG. 21 shows a detailed view of the interconnection board 1800 with the female clips 1900 which are mated with the male terminals 406 in the gate board 400 and the control terminals 1104 in the power modules 1100, shown in FIG. 20. The interconnection board allows the gate board to be space efficiently connected to the power modules when the boards in the assembly are in a horizontal arrangement, when compared to inverters with multiple vertically arranged gate driver boards.

Figure 22:
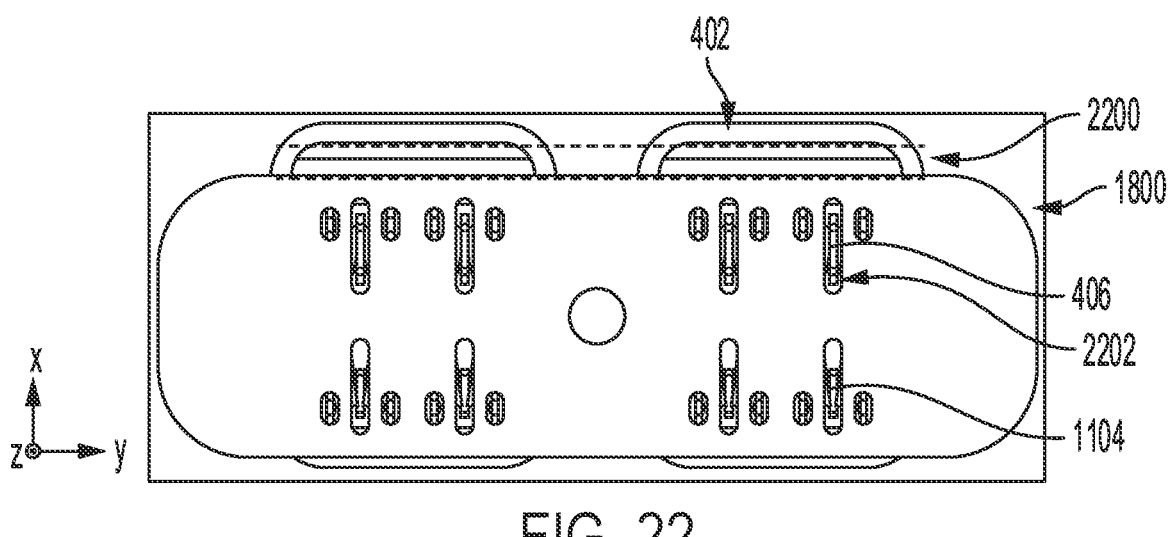
FIGS. 22-26 are views of different components which form the connection between the interconnection boards, the gate board, and the power modules.

FIG. 22 shows a top view of the interconnection board 1800. In the illustrated example, a gap 2200 between the interconnection board 1800 and the power board 600 is provided in the system. The gap 2200 allows for creepage distance between the boards, thereby reducing the chance of board degradation during operation, for instance.

The interconnection boards 1800 includes slots 2202 which let the male pin pass-through the board and allow for the connection to be visually inspected to avoid blind cabling, if desired. In this way, the inverter may be more reliably assembled.

Figure 23:
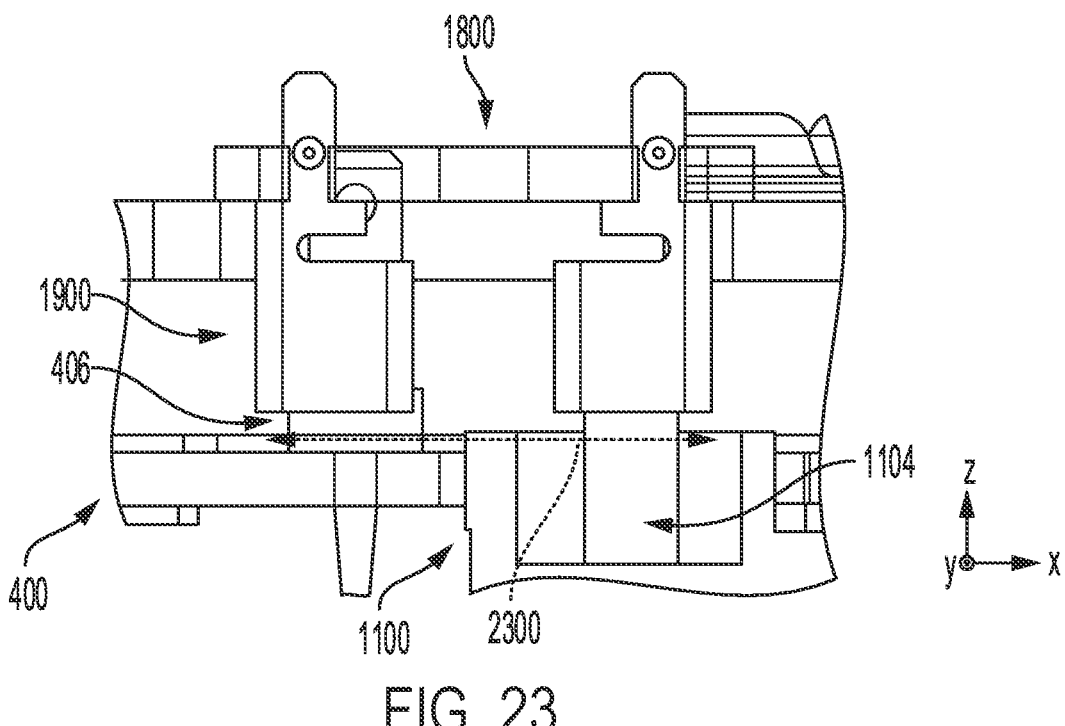

FIG. 23 shows another side view of the male terminals 406 in the gate board 400 and the control terminals 1104 in the power modules 1100 mated with the female clips 1900 in the interconnection boards 1800. The control terminals 1104 and the male terminals 406 may have a similar vertical height to allow the interconnection board to be effectively coupled thereto. As shown in FIG. 23, each of the gate board terminals 406 are arranged along an axis 2300 with one of the control terminals 1104, to enable the interconnection boards to be effectively attached thereto.

FIG. 24 shows a detailed view of the interconnection board 1800 with the female clips 1900. The female clips 1900 are clustered in groups of clips 2400 which allow for a space-efficient connection to be developed between the power modules and the gate board. The interconnection board 1800 further includes a substrate 2402 from which the female clips extend. The substrate 2402 may have a planar surface 2404 which is perpendicularly arranged with regard to the axis 1150.

FIG. 25 shows a detailed view of one of the female clips 1900. The female clip 1900 may include tangs 2500 which allow the female clip to be attached to the substrate of the interconnection board. Upper walls 2502 may extend from the tangs 2500. A gap 2504 to accommodate for mated attachment with the male terminals and pins is also provided in the female clip, in the illustrated example. However, other suitable female clip configurations may be used in other examples. The interconnection boards described herein allow the gate board and the power terminals to be effectively electrically coupled to one another. In this way, wired connections between the gate board and the power terminals may be avoided, if so desired. Consequently, a more compact and robust electrical connection is achieved between the gate board and the power modules. Further, the interconnection board connection is less susceptible to improper installation and allows for easier servicing of the assembly in the case of component replacement or repair due to degradation.

FIG. 26 shows a detailed view of one of the male terminals 406. The male terminal 406 includes a base 2600 for attaching to the substrate of the gate board and a tip 2602 which allows the terminal to mate with a corresponding female clip in the interconnection board.

FIGS. 27-28 show top and bottom views of the gate board 400. The openings 404 in the gate board 400 are illustrated. The openings 404 allow for the bodies of the power modules to extend through the gate board and be space efficiently arranged therewith.

The openings 405 are further depicted in FIGS. 27-28. The openings 405 allow the male control terminals in the power modules to extend there through. The holes 426 are further depicted in FIG. 27. The holes 426 allow the threaded inserts 1136, shown in FIG. 11, to extend there through for increased compactness. Further, the electrical interface 424 is also shown in FIG. 28.

FIGS. 29-30 show top and bottom views of the power board 600. The openings 630 in the power board 600 are again depicted along with the electrical interface 800. The DC bus electrical interface 601 and the electrical connectors 606 are again depicted.

FIGS. 31-32 show the power electronics assembly 1400 coupled to a HV tank 3110 which forms a system 3112. The power board 600 and the heat sink 1102 in the power electronics assembly 1400 are again depicted. The HV tank 3110 is positioned below the power electronics assembly 1400 in the illustrated example. However, the HV tank 3110 may be positioned in another suitable location in other examples, such as on top of the assembly, beside the assembly with regard to the (x-axis), or spaced away from the assembly, in different cases. Handles 3114 may be formed in the power electronics assembly 1400 to allow for quick installation and removal of the assembly, if desired. However, in alternate examples, the handles may be omitted from the assembly. Walls 3116 may further be included in the system to allow the power electronics assembly 1400 to be bolted into a desired location above the HV tank. Further, fans and other cooling features may be coupled to the power electronics assembly and/or the HV tank to allow the temperature of the assembly and/or HV tank to be reduced.

The power electronics assembly described above may omit cables such as twisted cables for connecting the power modules to the gate board, thereby reducing (or entirely avoiding) undesirable parasitic inductance. Consequently, the assembly's operating efficiency is increased. The compactness of the power electronics assembly extensively discussed above, allows the overall parts count in the assembly to be reduced when compared to other inverters making the assembly more efficient to manufacture, assembly, and repair. Further, the assembly's capabilities and reliability are increased when the compact power electronics module described above is deployed in an imaging system or other suitable system.

FIGS. 1-32 provide for a method of power electronics assembly operation. The method includes operating the power electronics assembly to convert DC power to AC power. The method may further include delivering the AC power to a downstream component such as the HV tank. The method may further include, in one example, delivering AC power from the HV tank to an X-ray tube. This power delivery may be carried out using HV cables, in one example. The method allows for DC to AC power conversion in a space-efficient package. Consequently, the assembly's applicability is expanded.

The disclosure provides support for a power electronics assembly that comprises a gate board electronically connected to a power board; a plurality of power modules which each include a plurality of power terminals which are electronically connected to the power board via a plurality of attachment devices; and a plurality of interconnection boards; wherein each of the plurality of interconnection boards are electronically connected to: the gate board via a plurality of gate board terminals; and one of the plurality of power modules via a plurality of control terminals. In a first example, the plurality of attachment devices may be connected to the power board via a plurality of conductive metallized surfaces. In a second example, the plurality of conductive metallized surfaces may be positioned on a bottom side of the power board. In a third example, the plurality of power modules may extend through a plurality of module openings in the gate board. In a fourth example, the gate board, the power board, and a heat sink may be stacked along an axis that is normal to an upper surface of the heat sink, wherein the plurality of power modules are coupled to the heat sink. In a fifth example, the gate board and power board may be electrically connected via a press-fit terminal interface. In a sixth example, the plurality of gate board terminals and the plurality of control terminals may extend through an interconnection board opening in the power board. In a seventh example, the power electronics assembly may further comprise, for each of the plurality of power modules, a thermal interface material in face sharing contact with the corresponding power module and a heat sink. In an eighth example, the power electronics assembly may further comprise an insulating sheet positioned between the gate board and the power board. In a ninth example, the power electronics assembly may further comprise a plurality of spacers mechanically coupling a heat sink to the power board, wherein the plurality of power modules are coupled to the heat sink.

The disclosure also provides support for a method for operation of a power electronics assembly that comprises operating the power electronics assembly to convert direct current (DC) power to alternating current (AC) power; and wherein the power electronics assembly includes: a gate board electronically connected to a power board; a plurality of power modules which each include a plurality of power terminals which are electronically connected to the power board via a plurality of attachment devices; and a plurality of interconnection boards; wherein each of the plurality of interconnection boards are electronically connected to: the gate board via a plurality of gate board terminals; and one of the plurality of power modules via a plurality of control terminals. In a first example, the method may further comprise transferring the AC power to a high voltage (HV) tank. In a second example, the method may further comprise a heat sink coupled to the plurality of power modules, wherein the power board, the gate board, and the heat sink form a stack along an axis which is normal to an upper surface of the heat sink.

The disclosure additionally provides support for a power electronics assembly for an imaging system, comprising: a gate board electronically connected to a power board via a press-fit electronic interface; a plurality of power modules which each include a plurality of power terminals which are electronically connected to the power board via a plurality of attachment devices; and wherein the plurality of power terminals extend through a plurality of module openings in the gate board; a plurality of interconnection boards; wherein each of the plurality of interconnection boards are electronically connected to: the gate board via a plurality of gate board terminals; and one of the plurality of power modules via a plurality of control terminals; and a heat sink coupled to the plurality of power modules. In a first example, the gate board, the power board, and the heat sink may be sequentially stacked along an axis. In a second example, the axis may be normal to an upper surface of the heat sink. In a third example, the plurality of attachment devices may extend through attachment device openings in the power board and are electrically coupled to a plurality of conductive metallized surfaces on an underside of the power board. In a fourth example, each of the plurality of gate board terminals may be aligned along an axis with one of the plurality of control terminals. In a fifth example, the power electronics assembly may further comprise an insulating sheet positioned between the gate board and the power board; and a plurality of spacers mechanically coupling a heat sink to the power board, wherein the plurality of power modules are coupled to the heat sink. In a sixth example, the power electronics assembly may further comprise, for each of the plurality of power modules, a thermal interface material in face sharing contact with the corresponding power module and a heat sink.

As used herein, the term "approximately" is construed to mean plus or minus five percent of the range unless otherwise specified.

As used herein, an element or step recited in the singular and preceded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A power electronics assembly, comprising:
a gate board electronically connected to a power board;
a plurality of power modules which each include a plurality of power terminals which are electronically connected to the power board via a plurality of attachment devices; and
a plurality of interconnection boards;
wherein each of the plurality of interconnection boards are electronically connected to the gate board via a plurality of gate board terminals; and one of the plurality of power modules via a plurality of control terminals.

2. The power electronics assembly of claim 1, wherein the plurality of attachment devices are connected to the power board via a plurality of conductive metallized surfaces.

3. The power electronics assembly of claim 2, wherein the plurality of conductive metallized surfaces are positioned on a bottom side of the power board.

4. The power electronics assembly of claim 1, wherein the plurality of power modules extend through a plurality of module openings in the gate board.

5. The power electronics assembly of claim 1, wherein the gate board, the power board, and a heat sink are stacked along an axis that is normal to an upper surface of the heat sink, wherein the plurality of power modules are coupled to the heat sink.

6. The power electronics assembly of claim 1, wherein the gate board and power board are electrically connected via a press-fit terminal interface.

7. The power electronics assembly of claim 1, wherein the plurality of gate board terminals and the plurality of control terminals extend through an interconnection board opening in the power board.

8. The power electronics assembly of claim 1, further comprising, for each of the plurality of power modules, a thermal interface material in face sharing contact with the corresponding power module and a heat sink.

9. The power electronics assembly of claim 1, further comprising an insulating sheet positioned between the gate board and the power board.

10. The power electronics assembly of claim 1, further comprising a plurality of spacers mechanically coupling a heat sink to the power board, wherein the plurality of power modules are coupled to the heat sink.

11. A method for operation of a power electronics assembly, comprising:
operating the power electronics assembly to convert direct current (DC) power to alternating current (AC) power; and
wherein the power electronics assembly includes:
a gate board electronically connected to a power board;
a plurality of power modules which each include a plurality of power terminals which are electronically connected to the power board via a plurality of attachment devices; and
a plurality of interconnection boards; and wherein each of the plurality of interconnection boards are electronically connected to the gate board via a plurality of gate board terminals; and one of the plurality of power modules via a plurality of control terminals.

12. The method of claim 11, further comprising transferring the AC power to a high voltage (HV) tank.

13. The method of claim 11, further comprising a heat sink coupled to the plurality of power modules, wherein the power board, the gate board, and the heat sink form a stack along an axis which is normal to an upper surface of the heat sink.

14. A power electronics assembly for an imaging system, comprising:

a gate board electronically connected to a power board via a press-fit electronic interface;

a plurality of power modules which each include a plurality of power terminals which are electronically connected to the power board via a plurality of attachment devices;

wherein the plurality of power terminals extend through a plurality of module openings in the gate board;

a plurality of interconnection boards;

wherein each of the plurality of interconnection boards are electronically connected to the gate board via a plurality of gate board terminals; and one of the plurality of power modules via a plurality of control terminals; and a heat sink coupled to the plurality of power modules.

15. The power electronics assembly of claim 14, wherein the gate board, the power board, and the heat sink are sequentially stacked along an axis.

16. The power electronics assembly of claim 15, wherein the axis is normal to an upper surface of the heat sink.

17. The power electronics assembly of claim 14, wherein the plurality of attachment devices extend through attachment device openings in the power board and are electrically coupled to a plurality of conductive metallized surfaces on an underside of the power board.

18. The power electronics assembly of claim 14, wherein each of the plurality of gate board terminals are aligned along an axis with one of the plurality of control terminals.

19. The power electronics assembly of claim 14, further comprising:

an insulating sheet positioned between the gate board and the power board; and a plurality of spacers mechanically coupling a heat sink to the power board, wherein the plurality of power modules are coupled to the heat sink.

20. The power electronics assembly of claim 19, further comprising, for each of the plurality of power modules, a thermal interface material in face sharing contact with the corresponding power module and a heat sink.

* * * * *